(12) United States Patent
Takasaki et al.

(10) Patent No.: US 7,678,211 B2
(45) Date of Patent: Mar. 16, 2010

(54) DEVICE AND METHOD FOR JOINING SUBSTRATES

(75) Inventors: Kosuke Takasaki, Kanagawa (JP); Kiyofumi Yamamoto, Kanagawa (JP); Kazuo Okutsu, Kanagawa (JP); Koji Tsujimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 719 days.

(21) Appl. No.: 10/594,069

(22) PCT Filed: Mar. 23, 2005

(86) PCT No.: PCT/JP2005/005999

§ 371 (c)(1),
(2), (4) Date: Sep. 26, 2006

(87) PCT Pub. No.: WO2005/093826

PCT Pub. Date: Oct. 6, 2005

(65) Prior Publication Data

US 2007/0194438 A1 Aug. 23, 2007

(30) Foreign Application Priority Data

Mar. 26, 2004 (JP) .............................. 2004-093628
Sep. 28, 2004 (JP) .............................. 2004-281895

(51) Int. Cl.
*B29C 65/48* (2006.01)
*B32B 37/12* (2006.01)
*B32B 38/18* (2006.01)

(52) U.S. Cl. .......................... 156/64; 156/230; 156/235; 156/238; 156/244.27; 156/247; 156/249

(58) Field of Classification Search ................... 156/64, 156/230, 234, 235, 238, 241, 244.27, 246, 156/247, 249, 289, 307.1, 307.3, 379, 379.6, 156/379.8, 537, 540, 541, 548; 359/223, 359/291, 295, 298; 257/40; 438/107–112, 438/458

See application file for complete search history.

(56) References Cited

U.S. PATENT DOCUMENTS

| 4,243,500 A | * | 1/1981 | Glennon ....................... 522/33 |
| 4,248,750 A | * | 2/1981 | Murakami et al. ............ 524/588 |
| 4,275,306 A | * | 6/1981 | Kato et al. ................... 250/548 |
| 4,671,846 A | * | 6/1987 | Shimbo et al. ............... 438/455 |
| 4,752,180 A | * | 6/1988 | Yoshikawa ................... 414/737 |
| 6,200,402 B1 | * | 3/2001 | Amo ............................ 156/235 |
| 6,285,064 B1 | * | 9/2001 | Foster ......................... 257/433 |

(Continued)

FOREIGN PATENT DOCUMENTS

JP 1-310565 A 12/1989

(Continued)

OTHER PUBLICATIONS

Machine translation of JP 05-160340.*

*Primary Examiner*—Philip C Tucker
*Assistant Examiner*—Sing P Chan
(74) *Attorney, Agent, or Firm*—Sughrue Mion, PLLC

(57) ABSTRACT

A device for joining substrates (11) is provided inside a clean booth (12). a single axis robot (46) and a five axis robot (47) convey a wafer (25) and a glass substrate (33). A transcribing station (91) obtains a transcribing film (112) on which adhesive is applied from a film supplying section (113), and presses the transcribing film (112) to the glass substrate (33) so as to transcribe the adhesive to the glass substrate (33). A peeling station (92) peels the transcribing film (112) from the glass substrate (33). A joining station (57) positions the wafer (25) and the glass substrate (33), adjusts parallelism of joining surfaces of the wafer (25) and the glass substrate (33), and joins these substrates together. Since the handling and the joining of the wafer (25), the glass substrate (33) and the transcribing film (112) are performed in the clean booth, it is prevented that a yield ratio of the product decreases because of the adhesion of foreign matters.

24 Claims, 24 Drawing Sheets

U.S. PATENT DOCUMENTS

| | | | |
|---|---|---|---|
| 6,444,076 B1 * | 9/2002 | Herndon et al. | 156/249 |
| 6,660,562 B2 * | 12/2003 | Lee | 438/112 |
| 7,089,986 B2 * | 8/2006 | Hayasaka et al. | 156/556 |

FOREIGN PATENT DOCUMENTS

| | | | |
|---|---|---|---|
| JP | 5-160340 A | 6/1993 |
| JP | 2002-231921 A | 8/2002 |
| JP | 2002-329850 A | 11/2002 |
| JP | 2003-163342 A | 6/2003 |
| JP | 2004-31266 A | 11/2004 |
| JP | 2004-312666 | 11/2004 |

\* cited by examiner

DEVICE AND METHOD FOR JOINING SUBSTRATES

TECHNICAL FIELD

The present invention relates to a device and a method for joining a semiconductor substrate and a sealing substrate when producing a chip size package.

BACKGROUND ART

A digital camera and a digital video camera with use of a solid state imaging device such as a CCD, a CMOS, and the like is in widespread use. A conventional solid state imaging device has a structure that an image sensor chip which is a semiconductor substrate is contained in a package and is sealed by a transparent glass rid. However, because of increasing demand for a mobile phone with the image-taking function and the like, the solid state imaging device is required to be small.

As a packaging method to downsize the solid state imaging device, a wafer-level chip size package (hereinafter WLCSP) is known. In the WLCSP, a semiconductor device is obtained by dicing a wafer after the packaging is completed in a semiconductor wafer process. A solid state imaging device manufactured by the WLCSP has the same size same as a bare chip.

Examples of the solid state imaging devices of WLCSP type are disclosed in Japanese Patent Laid-Open Publications No. 2002-329850 and No. 2003-163342, and a prior application of the applicant (Japanese Patent Application No. 2003-320271). In the Japanese Patent Laid-Open Publication No. 2002-329850, the solid state imaging device is formed in a way that a transparent cover glass is adhered on a frame which is formed of lamination of insulating resin and electrodes to surround an image sensor, so as to seal the image sensor. And a space between the image sensor and the cover glass is provided such that the condensing performance of the micro lens does not become worse.

In the Japanese Patent Laid-Open Publication No. 2003-163342, the solid state imaging device is formed such that a frame is formed by coating adhesive including filler around an image sensor, and then a transparent cover glass is adhered on the frame so as to seal the image sensor. And between the image sensor and the cover glass, a space determined by a diameter of the filler is provided. In the Japanese Patent Application No. 2003-320271, the solid state imaging device is formed such that a spacer as a frame surrounds an image sensor and a transparent cover glass is adhered on the spacer so as to seal the image sensor with appropriate space between the image sensor and the cover glass.

The solid state imaging devices described above are manufactured as described below. First, plural frames are formed on a transparent glass substrate which is a base material of the cover glass. Material of these frames is the insulating resin and the electrodes in the Japanese Patent Laid-Open Publication No. 2002-329850, while the adhesive including filler in the Japanese Patent Laid-Open Publication No. 2003-163342. In the Japanese Patent Application No. 2003-320271, the spacers are formed on the glass substrate and adhesive is applied on an end surface of the spacers. Next, the glass substrate and a wafer on which the plural image sensors and contact terminals are formed are joined such that the each image sensor is sealed by the frame and the glass substrate. Then the glass substrate with the wafer is diced into a plurality of the solid state imaging devices.

To increase the yield of the solid state imaging device manufacture, the wafer and the glass substrate should be free from sticking of the foreign matters. However, in the manufacturing methods of the Japanese Patent Laid-Open Publication No. 2002-329850 and No. 2003-163342 and the Japanese Patent Application No. 2003-320271, each manufacturing process is separated and the work needs to be transferred among respective manufacturing processes by human hands. Therefore, it is difficult to prevent that the foreign matters stick to the work.

In addition, in a process for coating the adhesive, the glass substrate is highly possible to be messed. However, in the Japanese Patent Laid-Open Publication No. 2002-329850, there is no statement about the process for coating the adhesive, therefore the possibility of messing the glass substrate in the coating process is not considered. In the Japanese Patent Laid-Open Publication No. 2003-163342, the adhesive including filler is coated on the glass substrate by printing. This method has problems that alignment of the printing position and control of coating thickness are very difficult. When the application quantity is not appropriate, it ends up with defective sealing. Further, it is possible that the adhesive slides or sticks to a portion of the glass substrate which faces to the image sensor at the time of printing, which leads to decrease in the yield ratio. In addition, if silicon is used as a material of the surface on which the adhesive is coated, there is possibility that the silicon sheds the adhesive because the silicon has bad wettability to the adhesive.

In the Japanese Patent Application No. 2003-320271, a transcribing film on which the adhesive is coated at constant thickness as an adhesive layer is superimposed on the glass substrate, and then the transcribing film is rolled up to be peeled off from top end of the glass substrate, such that the adhesive layer is transcribed on the spacers on the glass substrate. Accordingly, it is easy to control the coating thickness of the adhesive.

However, in the Japanese Patent Application No. 2003-320271, the plastic film is peeled by human hands. Therefore, there are problems that curvature of the transcribing film and angle between the film and the transcribing film, both of which largely affect performance of the peeling, are unstable in peeling. For example, if the curvature of the transcribing film is too small, the peeling cannot be performed smoothly. If the curvature is too large, membrane of the adhesive is created between the transcribing film and the spacer. The membrane bursts and splashes to mess the glass substrate when exceeds the viscosity of the adhesive.

In addition, if the wafer and the glass substrate are not in parallel with facing each other at the time of joining, their joining positions become misaligned. For example, when a parallelism between two 6-inch wafers is 60 μm, a misaligned distance between two wafers becomes 10 μm. In the solid state imaging device which has small size, the distance between the image sensor and the frame is also small. Accordingly, the adhesive flows to the image sensor and the contact terminals when the joining positions are slightly misaligned that causes deterioration of the yield. Therefore, the misaligned distance between the wafer and the glass substrate needs to be few micrometers or less. For satisfying the requirement, the parallelism between the two substrates needs to be 10 μm or less.

For adjusting the parallelism of the substrates 10 μm or less, the parallelism needs to be measured. As stated above, for preventing the sticking of foreign matters, the parallelism measurement should be performed in a non-contact way. Conventionally, the non-contact parallelism measurement is performed by laser displacement gauges. However, the solid state imaging device of WLCSP type, which uses opaque material for the spacer, can not be measured in parallelism by using the laser displacement gauges. Note that the Japanese Patent Laid-Open Publication No. 2002-329850 and No. 2003-163342 and the Japanese Patent Application No. 2003-320271 do not describe solutions for these problems in joining the substrates.

An object of the present invention is to provide a device and a method for joining a wafer (semiconductor substrate) and a glass substrate (sealing substrate) with high yield ratio.

DISCLOSURE OF INVENTION

In order to achieve the object, a device for joining substrates of the present invention comprises a substrate supplying section for supplying a semiconductor substrate and a sealing substrate, a transcribing sheet supplying section for supplying an elastic transcribing sheet on which adhesive is coated, a transcribing sheet pressurization section for pressurizing together a joint surface of the transcribing sheet on which the adhesive is coated and a joint surface of the sealing substrate, a transcribing sheet peeling section for peeling the transcribing sheet from the sealing substrate so as to form an adhesive layer on the sealing substrate, a parallelism adjusting section for adjusting parallelism of the joint surface of the semiconductor substrate and the joint surface of the sealing substrate on which the adhesive layer is formed, a substrate joining section for adjusting positions of the semiconductor substrate and the sealing substrate and then joining the semiconductor substrate and the sealing substrate which are adjusted their positions, and a substrate conveying mechanism for conveying the semiconductor substrate, the sealing substrate and the transcribing sheet among the respective sections. If an image sensor is formed on the semiconductor substrate, the sealing substrate is formed of a transparent material.

In a preferred embodiment, the transcribing sheet peeling section comprises a peeling roller provided close to one end of the sealing substrate which is set at a position for peeling the transcribing sheet, a long adhesive tape being hanged on the peeling roller and contacting one end of the transcribing sheet, a roller moving mechanism for moving the peeling roller from a position near the one end of the sealing substrate to a position near another end of the sealing substrate, and a winding section for winding the adhesive tape in synchronization with the move of the peeling roller by the roller moving mechanism so as to keep a constant angle between the peeled transcribing sheet and the joint surface of the sealing substrate.

The transcribing sheet peeling section further comprises a roller clearance adjusting mechanism for adjusting clearance between the peeling roller and the transcribing sheet before being peeled. It is preferable that a clearance between an outer peripheral surface of the adhesive tape hanged on the peeling roller and the transcribing sheet is 0.1 mm or less when the transcribing sheet is peeled. It is preferable that a diameter of the peeling roller is between 15 mm and 20 mm.

As the transcribing sheet, an antistatic plastic film is used. In addition, the transcribing sheet pressurization section pressurizes the transcribing sheet through a cushion. As the cushion, a sponge rubber having hardness of ASKER-C 20-40 is preferably used.

The parallelism adjusting section comprises a plurality of substrate clearance measurement section for measuring clearance between the joint surface of the semiconductor substrate and the joint surface of the sealing substrate at plural measurement points and a substrate inclination adjusting section for adjusting inclination of the semiconductor substrate or the sealing substrate based on measurement result from the substrate clearance measurement section.

The substrate clearance measurement section comprises a plurality of transmission illuminating devices for emitting transmission light to the measurement points between the joint surface of the semiconductor substrate and the joint surface of the sealing substrate, a plurality of substrate clearance imaging devices provided corresponding to the transmission illuminating devices for imaging the semiconductor substrate and the sealing substrate which are illuminated at the measurement points, and a substrate clearance calculating device for calculating length of the clearance between the joint surfaces of the semiconductor substrate and the sealing substrate at the measurement points by analyzing image data from the plurality of substrate clearance imaging devices. It is preferable that the transmission illuminating device has a converging angle of 1° or less. In addition, it is preferable that the substrate clearance imaging device has a telecentric lens in which only the parallel lights can enter.

Another substrate clearance measurement section has a laser measurement device for measuring distance between the joint surface of the semiconductor substrate and the joint surface of the sealing substrate at predetermined points.

Another parallelism adjusting section comprises a plurality of displacement amount measuring section for measuring displacement amounts of the joint surface of the semiconductor substrate and the joint surface of the sealing substrate from predetermined reference positions in a direction perpendicular to the joint surfaces at plural measurement points, and a substrate inclination adjusting section for adjusting inclination of the semiconductor substrate or the sealing substrate based on measurement result from the displacement amount measuring section.

The substrate inclination adjusting section comprises a plurality of actuators positioned corresponding to the measurement positions of the measuring section, for moving plural predetermined positions of the semiconductor substrate or the sealing substrate in a perpendicular direction of the joint surface, an actuator controller for controlling the actuators based on measurement result from the measuring section, and a plate supporting mechanism for swingably supporting either one of the semiconductor substrate and the sealing substrate to follow the other substrate when the semiconductor substrate and the sealing substrate are joined, with the swing reference of movement of the supported substrate being in the same plane as the joint surface of the supported substrate.

Further alternative parallelism adjusting section comprises a support plate for holding the semiconductor substrate or the sealing substrate, and a plate holding mechanism for holding the support plate in a swingable manner with the semiconductor substrate and the sealing substrate contacting each other, and for fixing the support plate a fixed manner after the supported substrate swings to follow the other substrate.

The plate holding mechanism comprises a spherical shaft integrated with the support plate, a spherical receiver for swingably supporting the spherical shaft, and an air pump for sending air in between the spherical shaft and the spherical receiver so as to allow movement of the spherical shaft and for sucking the air from between the spherical shaft and the spherical receiver so as to fix the spherical shaft.

In addition, for controlling viscosity of the adhesive, light-delayed curing adhesive may be used as the adhesive, and an illumination station may be provided for irradiating light to start the curing of the adhesive.

According to the present invention, a method for joining substrates comprises steps of supplying a semiconductor substrate, supplying a sealing substrate, supplying an elastic transcribing sheet on which adhesive is applied, pressurizing together a joint surface of the transcribing sheet coated with the adhesive and a joint surface of the sealing substrate, peeling the transcribing sheet from one end of the sealing substrate with maintaining a constant curvature so as to form an adhesive layer on the sealing substrate, adjusting parallelism of the joint surfaces of the semiconductor substrate and the sealing substrate, adjusting positions of the semiconductor substrate and the sealing substrate, and joining the semiconductor substrate and the sealing substrate which are adjusted their positions.

The step of adjusting parallelism of the joint surfaces of the semiconductor substrate and the sealing substrate includes steps of measuring clearance between the joint surface of the semiconductor substrate and the joint surface of the sealing substrate at plural measurement points, and adjusting inclinations of the semiconductor substrate or the sealing substrate based on the measurement result.

The step of measuring length of clearance between the joint surfaces of the semiconductor substrate and the sealing substrate includes steps of making the joint surfaces of the semiconductor substrate and the sealing substrate face each other with predetermined clearance, emitting transmission light and imaging plural positions between the joint surfaces of the semiconductor substrate and the sealing substrate, and calculating lengths of the clearances between the joint surfaces of the semiconductor substrate and the sealing substrate by analyzing image data obtained from the imaging.

The step of adjusting inclination of the substrate includes a step of swinging either one of the semiconductor substrate or the sealing substrate to follow the other substrate, in the same level as the joint surface of the substrate.

Since the feeding of the semiconductor substrate, the sealing substrate and the transcribing sheet, and the coating the adhesive are performed not with human hands according to the device and method for joining substrates of the present invention, foreign matters do not stick to the substrates. Since the peeling of the transcribing sheet with the curvature and angle of the peeling maintained constant is automatically performed by the transcribing sheet peeling section, it is prevented that the substrates are messed with membrane of the adhesive created at the time of the peeling of the transcribing sheet.

Since the curvature of the peeling of the transcribing sheet is determined by the peeling roller, it can be maintained constant through the peeling. In addition, because the curvature can be modified by moving the peeling roller in the direction of the joint surface or changing the peeling roller with another peeling roller which has another diameter, the condition of the peeling can be adjusted adequately.

Since the long adhesive tape is used for peeling the transcribing sheet, the transcribing sheet can be easily and less costly held without the use of complicated mechanisms, and the peeling angle of the transcribing sheet can be easily controlled. Also, because the peeled transcribing film can be wound with the used adhesive tape, complicated mechanisms or devices for processing the peeled transcribing film are not required. In addition, because the new adhesive tape is supplied at the same time as the used adhesive tape is wound, efficiency in the production of chip size packages is improved.

In addition, an antistatic plastic film is used as the transcribing sheet, and it can prevents the transcribing sheet from sticking to portions not relate to handling of the sheet in the device and thereby from hindering the transportation of the transcribing sheet. In addition, since the transcribing sheet is pressed to the sealing substrate through the cushion, it is prevented that the adhesive flows out from the spacer by excessive pressure of the transcribing sheet.

Since the parallelism measurement for the parallelism adjustment is performed in a non-contact manner by the substrate clearance measurement section, the displacement amount measuring section or the laser measurement device, it is prevented that the semiconductor substrate and the sealing substrate are messed with the measuring instruments. Further, the clearance between the substrates can be precisely measured because the clearance is illuminated by transmission light for imaging, and the distance of the clearance is calculated based on the image data obtained by the imaging. In addition, since the converging angle of the transmission light is 1° or less, and the telecentric lens is used, the measurement is not influenced by light reflected on the joint surfaces of the substrates. Accordingly, the clearance can be precisely measured even if the measurement position of the substrates is apart from a focus position of an imaging camera. The efficiency in the production of the package can be more improved because there is no need to precisely adjust the focus position of the imaging camera and the measurement position of the substrates.

Because the plate supporting mechanism of the substrate inclination adjusting section swings the substrate with the swing reference of the supported substrate being in the same level as the joint surface of the supported substrate, therefore misalignment of the joining position between the substrates, which is caused by movement of the supported substrate, can be minimized.

Since the further alternative parallelism adjusting section allows that the joint surfaces of the semiconductor substrate and the sealing substrate contact to each other, such that the one substrate follows the other substrate, therefore the parallelism of the substrates can be adequately adjusted even if flatness of each of the substrate differs from the others. In addition, this construction does not need the measuring instruments and the analyzer for analyzing the measurement data. Therefore, the parallelism adjustment can be performed less costly.

If the light-delayed curing adhesive is used as the adhesive, the viscosity of the adhesive can be controlled inside the device. Therefore, wettability of the adhesive to the spacer can be improved in a small amount of time while the spacer is kept from the adhesion of foreign matters.

BEST MODE FOR CARRYING OUT THE INVENTION

Figure 1:
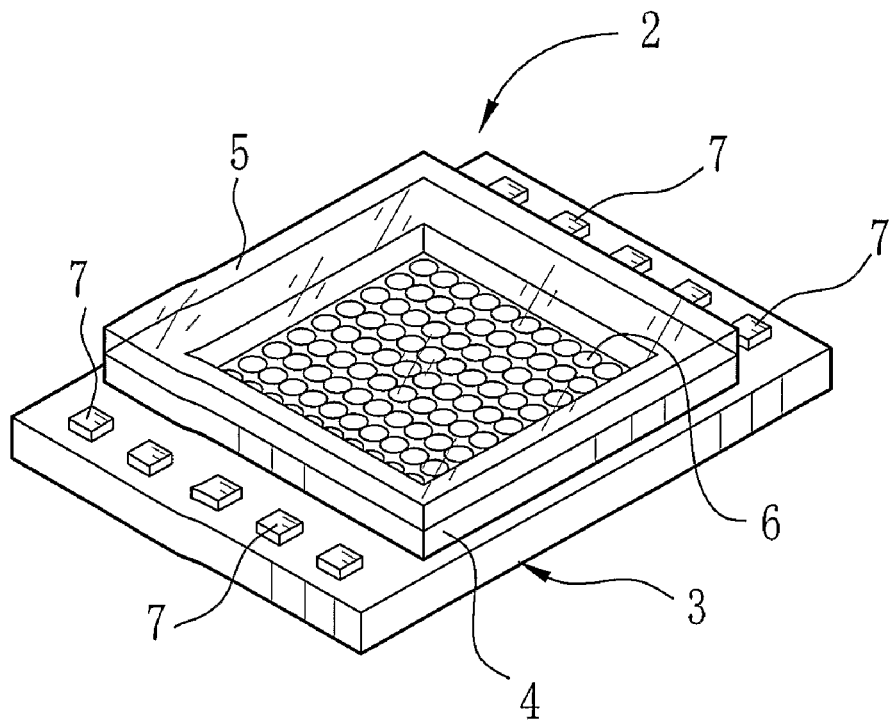
FIG. 1 is a perspective view of a solid state imaging device manufactured by a device for joining substrates of the present invention.
Figure 2:
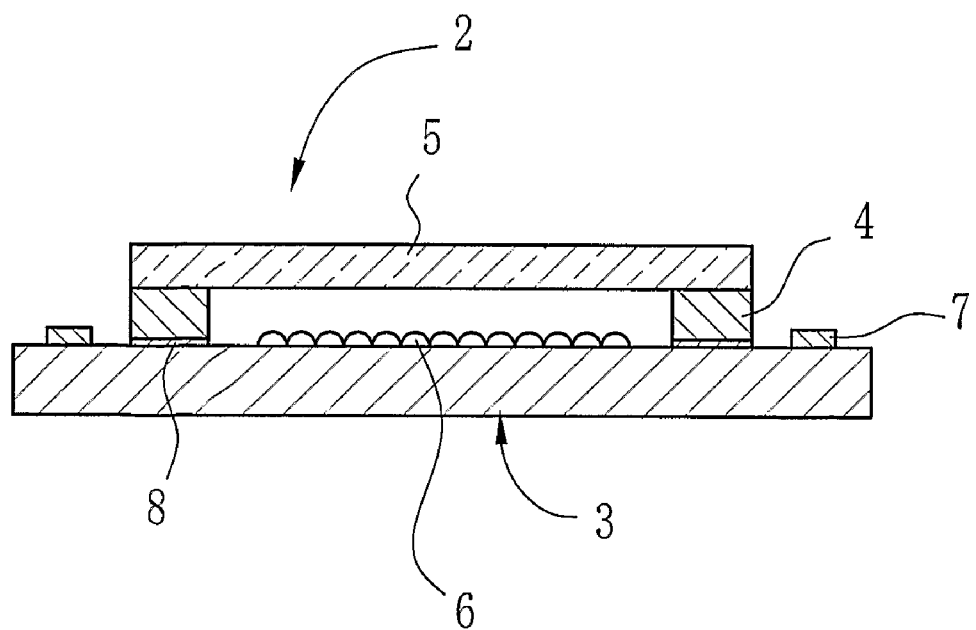
FIG. 2 is a partially sectional view of the solid state imaging device.

As shown in FIG. 1 and FIG. 2, a solid state imaging device 2 of WLCSP type is constructed of an image sensor chip 3, a frame-like spacer 4 which is adhered on the image sensor chip 3 with an adhesive 8, and a cover glass 5 which is adhered above the spacer 4 so as to seal the inside of the spacer 4.

On the image sensor chip 3, an image sensor 6 including plural pixels which generate electronic signal according to amount of received light and a plurality of contact terminals 7 which electrically connect to the image sensor 6, are provided. The image sensor 6 is, for example, a CCD (Charge Coupled Device) on which color filters and a micro lens are superimposed. The contact terminals 7 are formed such that conductive material is printed, for example, on the image sensor chip 3. In a similar way, the each contact terminal 7 connects to the image sensor 6 by printed wiring.

The spacer 4 is formed of inorganic material such as silicon, and surrounds the image sensor 6. A transparent α-ray shielding glass is used as the cover glass 5, so as to prevent that photodiodes, which constitute the pixels of the CCD, are destroyed by the α-ray. Since a space between the image sensor 6 and the cover glass 5 is provided, the condensing performance of the micro lens do not become worse.

The solid state imaging device 2 is embedded in a small electronic apparatus (such as a digital camera, a mobile phone and the like), together with a taking lens for focusing object images on the image sensor 6, a memory for storing the image data generated according to the image taking, a control circuit for controlling the solid state imaging device 2, and so on. Since the solid state imaging device 2 of WLCSP type has the size and the thickness nearly equal to the bare chip, the apparatus incorporating the solid state imaging device 2 can be downsized.

Figure 3:
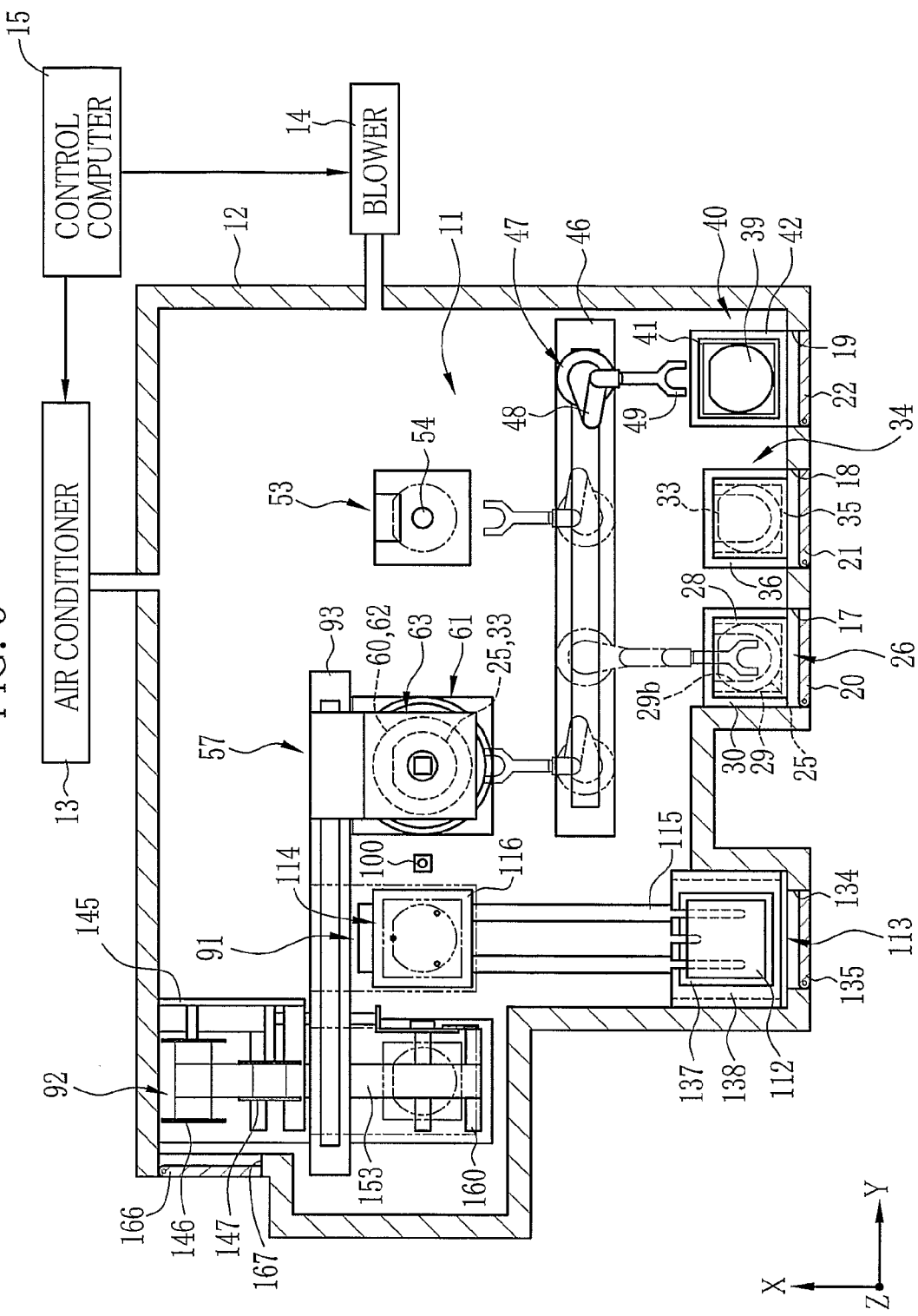
FIG. 3 is a schematic view showing a structure of the device for joining substrates.

As shown in FIG. 3, a device for joining substrates 11 which is used for manufacturing the solid state imaging device 2 is provided in a clean booth 12 sealed from the outside. Note that, for illustrating purpose, two directions which are parallel to a sheet of FIG. 3 and are at right angles to each other are determined as an X-axis direction and a Y-axis direction, and a direction perpendicular to a face formed by the X-axis and the Y-axis is determined as a Z-axis direction.

The clean booth 12 connects to an air conditioner 13 which has a HEPA filter or the like, therefore clean air is downflowing in the clean booth 12. Dusts are gathered around a floor surface of the clean booth 12 by the clean air, aspirated by a blower 14, and exhausted to the outside of the clean booth 12. The air conditioner 13 and the blower 14 are controlled by a control computer 15 which controls the device for joining substrates 11.

Note that sources of foreign matters, such as moving parts of devices in the clean booth 12, can be covered by covers and so on, for making the inside of the clean booth 12 more cleaner. In addition, for preventing reflection of the downflowing of the clean air, the floor surface of the clean booth 12 and bases of the devices inside the clean booth 12 may be formed of punching members or the like.

On a side wall of the clean booth 12, openings 17-19 for supplying and discharging work in and from the device for joining substrates 11 in the clean booth 12, and doors 20-22 for opening and closing the openings 17-19 are provided. Note that for preventing air including the foreign matters flowing into the clean booth 12 when the doors 20-22 are opened, the air conditioner 13 and the blower 14 keep barometric pressure inside the clean booth 12 higher than that of outside the clean booth 12.

Figure 4:
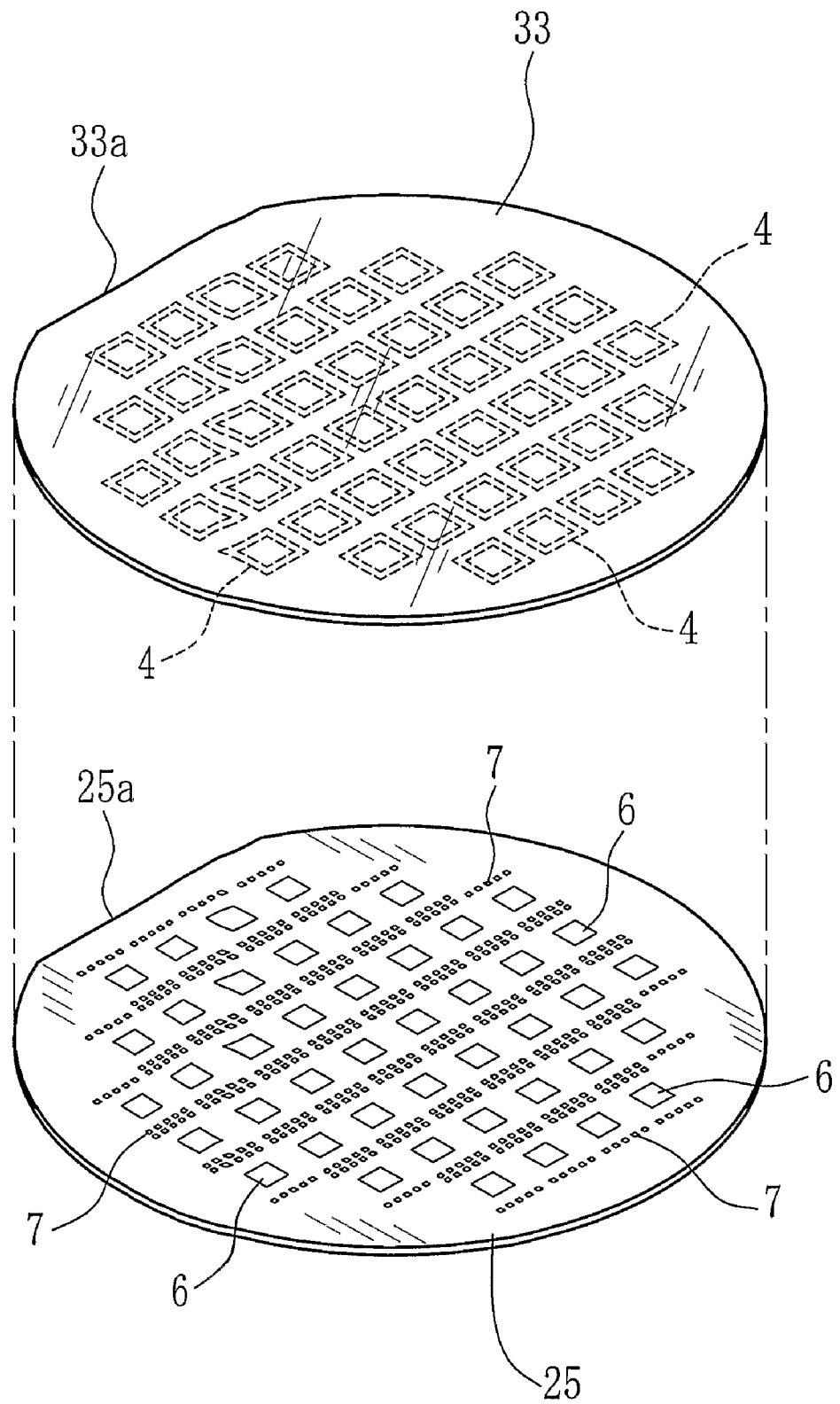
FIG. 4 is a perspective view showing a wafer and a glass substrate.

Wafers 25 which are semiconductor substrates are supplied into the clean booth 12 through the opening 17. Behind the opening 17, a wafer supplying section 26 for supplying the wafers 25 into the device for joining substrates 11 is provided. As shown in FIG. 4, the wafer 25 is, for example, eight inches in size. On one surface of the wafer 25, the plurality of the image sensors 6 and the plurality of the contact terminals 7 which correspond to the respective image sensors 6 are formed by a semiconductor wafer process. The image sensor chip 3 of the solid state imaging device 2 is formed by dividing the wafer 25 into individual image sensor 6.

Figure 5:
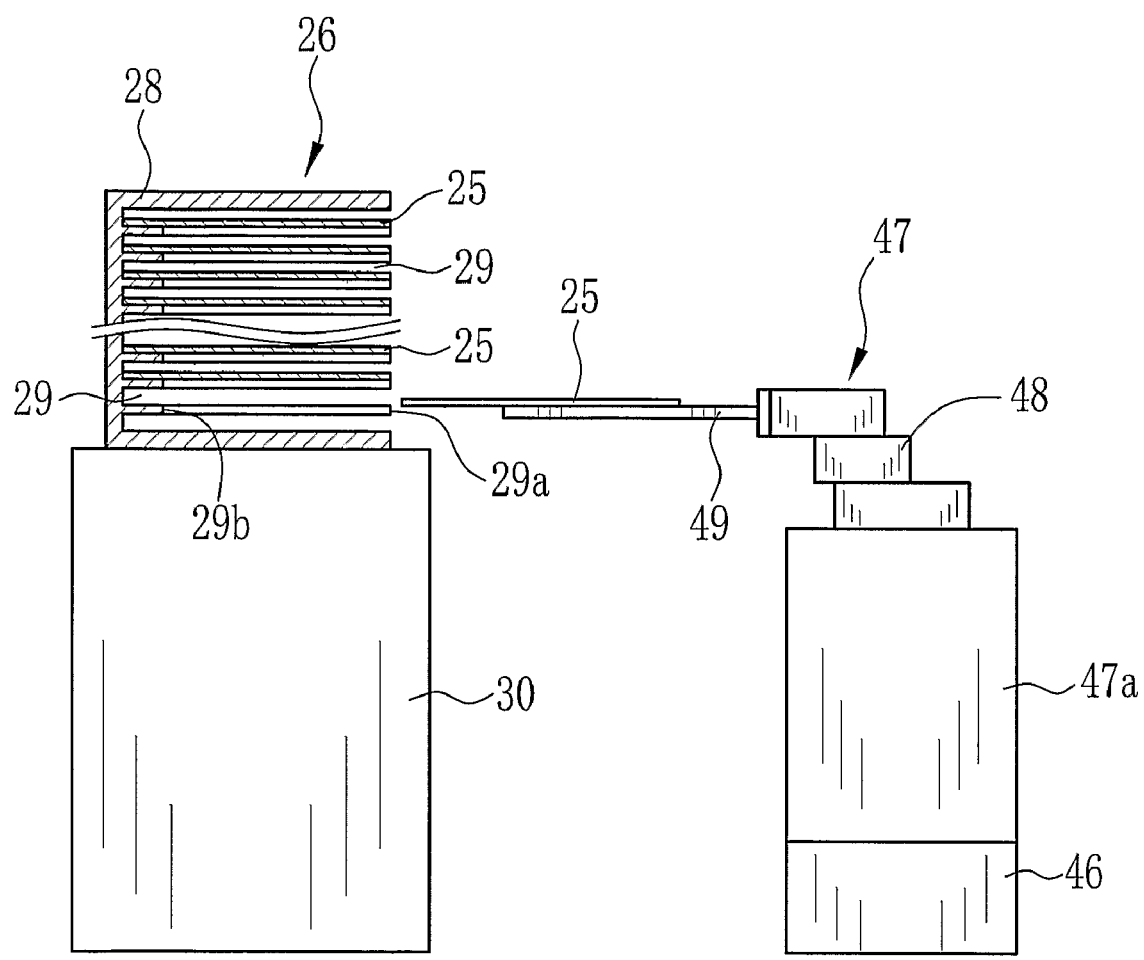
FIG. 5 is a schematic view showing a wafer supplying section.

As shown in FIG. 5, the wafer 25 is contained in a known open cassette 28 such that the surface of the wafer on which the image sensor 6 and so on are formed is directed upward, and is set on a base 30 provided in the wafer supplying section 26. On the open cassette 28, plural container slot 29 for containing the wafer 25 one by one are provided along the vertical direction. On a support plate 29a of each of the container slot 29, a cutout 29b, in which an adsorption hand 49 of a robot (described later) is inserted when the robot holds the bottom surface of the wafer 25 to lift up, is formed.

Glass substrates 33 which are sealing substrate are supplied into the clean booth 12 through the opening 18. Behind the opening 18, a glass substrate supplying section 34 for supplying the glass substrates 33 into the device for joining substrates 11. As shown FIG. 4, the glass substrate 33 is formed such that the frame-like spacers 4 is formed on one surface of the transparent α-ray shielding glass which has the same size and shape as the wafer 25. The cover glass 5 of the solid state imaging device 2 is formed such that the glass substrate 33 is joined to the wafer 25 such that the each spacer 4 surrounds the each image sensor 6 on the wafer 25 and is cut with the wafer 25. The glass substrate 33 is contained in an open cassette 35 similar to the open cassette 28, such that the surface of the substrate on which the spacers 4 are formed is directed upward, and is set on a base 36.

The spacer 4 is formed on the glass substrate 33 in such a way as described next. First, on the glass substrate 33, inorganic materials such as silicon are superimposed to form an inorganic material coat by spin coating or CVD. Then the plurality of the spacer 4 is formed from the inorganic material coat by photolithography, development, etching or so on. Note that the inorganic material coat may be formed by joining the glass substrate 33 and a silicon wafer together.

The wafer 25 and the glass substrate 33 which are joined together at the device for joining substrates 11 in the clean booth 12 (hereinafter joined substrate 39) are discharged outside the clean booth 12 through the opening 19. Behind the opening 19, a joined substrate discharging section 40 is provided. In the joined substrate discharging section 40, a substrate case 41 for containing one of the joined substrate 39 is disposed. The substrate case 41 is, for example, a tray formed of plastic.

Figure 6:
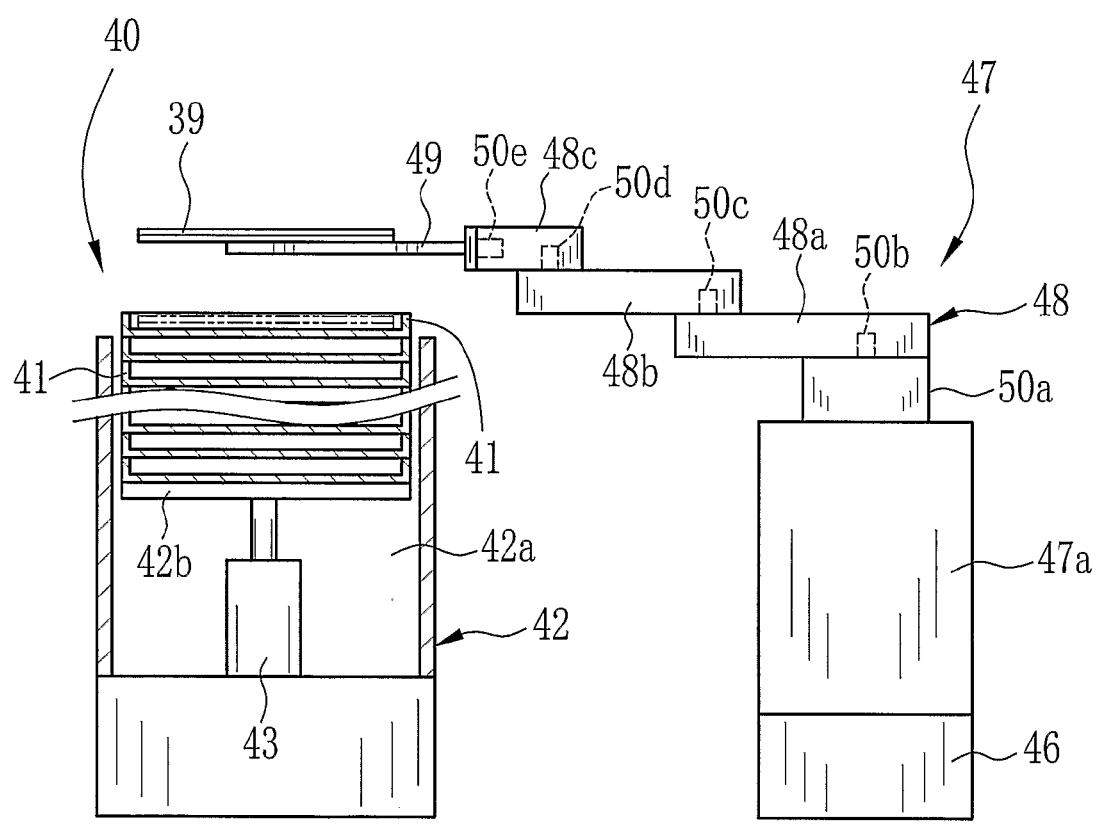
FIG. 6 is a schematic view showing a joined substrate discharging section.

As shown in FIG. 6, in the joined substrate discharging section 40, a case supplying device 42 for automatically supplying the plural substrate case 41 is provided. The case supplying device 42 is constituted of a container 42a for stacking and containing the plural substrate case 41, a support plate 42b on which the plural substrate case 41 are supported, and an actuator 43 for moving the support plate 42b up and down. The actuator 43 is controlled by the control computer 15.

When the joined substrate 39 is contained in the uppermost substrate case 41 of the case supplying device 42, the substrate case 41 is discharged from the opening 19 to outside the clean booth 12 to be conveyed to next manufacturing line. The case supplying device 42 drives the actuator 43 to push up the stacked plural substrate case 41 such that the uppermost substrate case 41 is positioned behind the opening 19.

Note that in this embodiment, although the open cassettes 28, 35 as the carriers of the wafer 25 and the glass substrate 33, known FOUP (Front Opening Unified Pod) can be used instead of the open cassette. When the FOUP is used, load ports may be provided on the side wall of the clean booth 12, for feeding the wafer 25 and the glass substrate 33 from outside of the clean booth 12.

Behind the wafer and glass substrate supplying sections 26 and 34, and the joined substrate discharging section 40 in the clean booth 12, a single axis robot 46 and a five axis robot 47 which comprise a substrate conveying mechanism are provided. The single axis robot 46 moves the five axis robot 47 in the Y-axis direction and stops the movement at predetermined positions. Each stop position of the five axis robot 47 is a wafer receiving position where the wafer supplying section 26 faces, a glass substrate receiving position where the glass substrate supplying section 34 faces, a joined substrate discharging position where the joined substrate discharging section 40 faces, an alignment position where an alignment station 53 faces, and a joining position where a joining station 57 faces. Note that as described later in detail, the alignment station 53 is for tentatively positioning of the wafer 25 and the glass substrate 33, and the joining station 57 is for joining the wafer 25 and the glass substrate 33.

As shown in FIG. 5 and FIG. 6, the five axis robot 47, so-called a horizontal articulated robot or a scalar robot, is well-known used for handling the wafer and the like in manufacturing the semiconductor devices. The five axis robot 47 comprises a body 47a supported by the single axis robot 46, a robot arm 48 attached on an upper portion of the body 47a, and a suction hand 49 attached on an end of the robot arm 48. The suction hand 49 has a thin plate-like shape, and scoops and holds the wafer 25 and the glass substrate 33 by vacuum sucking.

A first axis 50a of the five axis robot 47 is provided in the body 47a, for moving whole of the robot arm 48 up and down (in the Z-axis direction). The robot arm 48 comprises three arms 48a-48c, second to fourth axes 50b-50d for moving the suction hand 49 in horizontal direction by bending and stretching the arms 48a-48c, and a fifth axis 50e for inverting the suction hand 49. The single axis robot 46 and the five axis robot 47 are controlled by the control computer 15.

At first, the five axis robot 47 is moved to the glass substrate receiving position by the single axis robot 46, and picks up the single glass substrate 33 from the open cassette 35. Next, the five axis robot 47 is moved to the alignment position, and sets the glass substrate 33 on the alignment station 53. Note that because the glass substrate supplying section 34 and the alignment station 53 are faced across the single axis robot 46, in practice only the second axis 50b of the robot arm 48 is rotated to face the alignment position. After finishing the operation in the alignment station 53, the five axis robot 47 receives the glass substrate 33 from the alignment station 53, and is moved to the joining station 57 by the single axis robot 46, to set the glass substrate 33 on the joining station 57.

After setting the glass substrate 33 on the joining station 57, the five axis robot 47 is moved to the wafer receiving position, and takes the single wafer 25 from the open cassette 28. Then the wafer 25 is set on the alignment station 53. After finishing the operation in the alignment station 53, the five axis robot 47 receives the wafer 25 from the alignment station 53, and set the wafer 25 on the joining station 57.

After the wafer 25 and the glass substrate 33 are joined by the device for joining substrates 11, the five axis robot 47 receives the joined substrate 39 from the joining station 57. Then the single axis robot 46 moves the five axis robot 47 to the joined substrate discharging position, where the joined substrate 39 is contained in the substrate case 41 of the joined substrate discharging section 40.

As the alignment station 53, known alignment device for wafer is used for tentatively positioning the wafer 25 and the glass substrate 33 in the X-axis direction, the Y-axis direction, and the rotational direction. The alignment station 53 is controlled by the control computer 15. By the five axis robot 47, the wafer 25 or the glass substrate 33 from the wafer supplying section 26 or the glass substrate supplying section 34 is set on a pad 54 of the alignment station 53 without being inverted.

In the alignment station 53, a motor rotates the pad 54, and an optical sensor detects the orientation flat 25a or 33a or notches of the wafer 25 or the glass substrate 33. Then the direction of the wafer 25 or the glass substrate 33 is aligned such that the rotational position of the pad 54 is controlled according to the detected position of the orientation flat 25*a* or 33*a* or notches.

In addition, the pad 54 is supported by a known XY table for tentatively positioning the wafer 25 and the glass substrate 33 in the X-axis direction and the Y-axis direction by moving the pad 54. The position accuracy of the wafer 25 and the glass substrate 33 in the alignment station 53 is ±0.6 mm in the X-axis direction and the Y-axis direction, and ±0.2° in the rotational direction.

Figure 7:
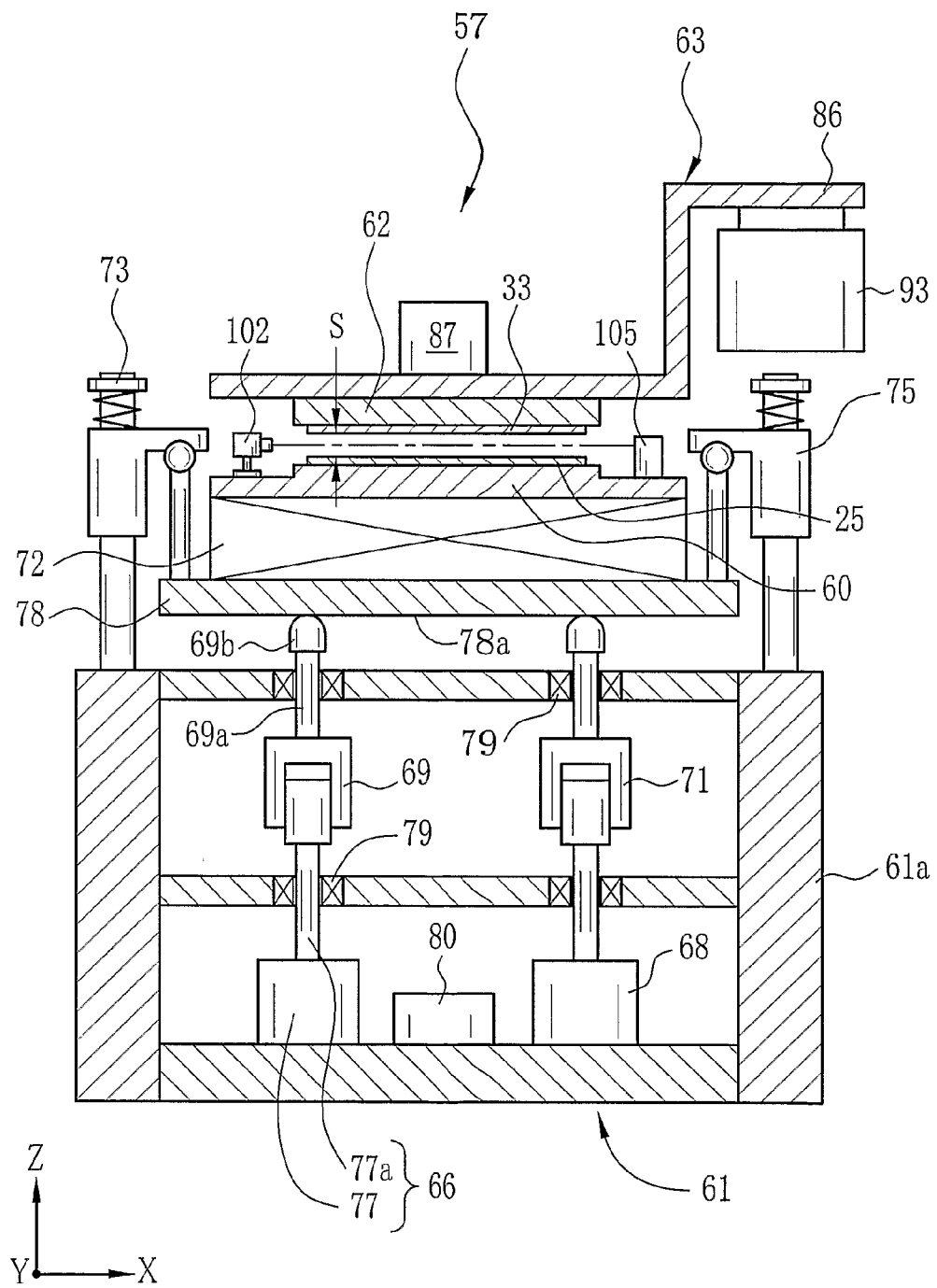
FIG. 7 is a partially sectional view showing a structure of a joining station.
Figure 8:
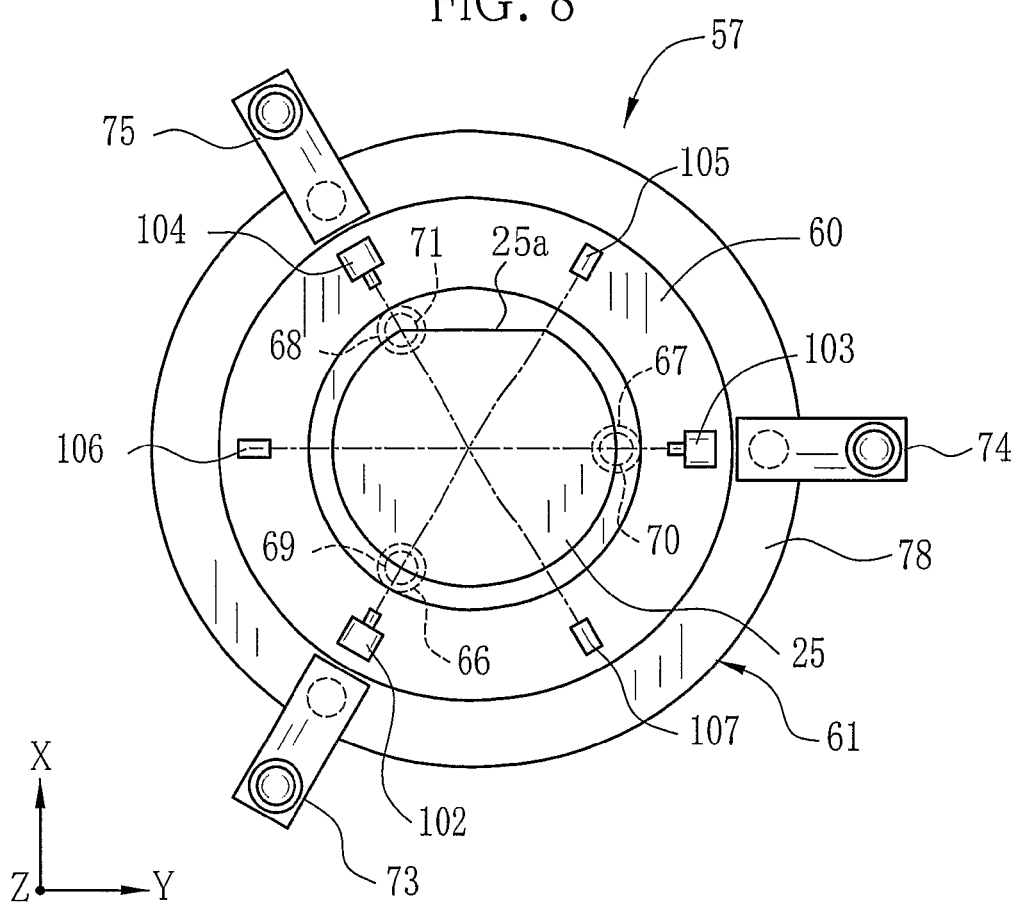
FIG. 8 is a top view of an underside joining unit.
Figure 9:
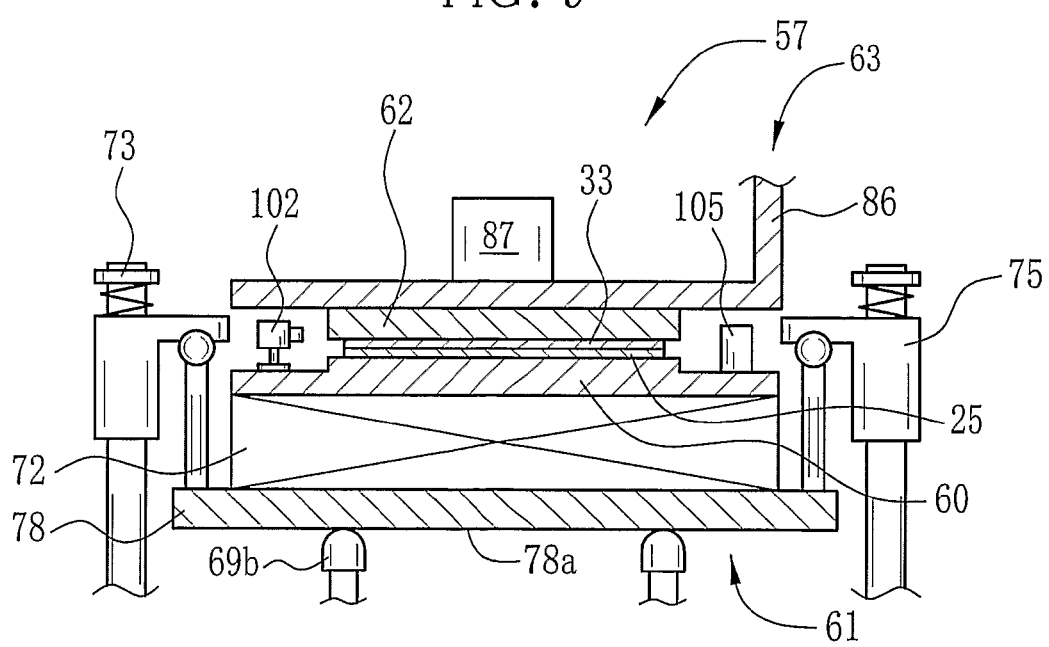
FIG. 9 is a partially sectional view showing a state of the joining station in joining position.

As shown in FIG. 7 and FIG. 8, the joining station 57 comprises an underside joining unit 61 having a wafer support plate 60 for holding the wafer 25 or the glass substrate 33 on its top surface, and an topside joining unit 63 having a glass support plate 62 for holding the glass substrate 33 at a position above the wafer support plate 60. As shown in FIG. 9, when joining the wafer 25 and the glass substrate 33, the underside joining unit 61 moves upward so as to press the wafer 25 against the glass substrate 33.

The wafer support plate 60 is formed of a ceramic plate having planarity, for example, and holds the glass substrate 33 and the wafer 25, stuck sequentially by the five axis robot 47, by the vacuum sucking. The glass support plate 62 receives and holds the glass substrate 33 from the wafer support plate 60 such that the wafer support plate 60 can receive the wafer 25. Note that the wafer support plate 60 may be formed of a metal plate such as a stainless plate, if the plate has high planarity.

The underside joining unit 61 comprises first to third lifting actuators 66-68 for adjusting inclination of the wafer 25 and pressing the wafer 25 against the glass substrate 33, first to third pressure control cylinders 69-71 for controlling the pressing forces of the first to third lifting actuators 66-68 when joining the wafer 25 and the glass substrate 33, an XYθ table 72 for moving the wafer support plate 60 in the X-axis direction, Y-axis direction and the rotational direction, and first to third plate supporting mechanism 73-75. The first to third lifting actuators 66-68 are positioned equiangularly at intervals of 120° around the center of the wafer support plate 60, and the first to third plate supporting mechanism 73-75 are positioned respectively on respective extension lines from the center of the wafer support plate 60 toward the respective lifting actuators 66-68.

The first lifting actuator 66 has a shaft 77*a* moving in the Z-axis direction by rotation of a motor 77. To the shaft 77*a*, the first pressure control cylinder 69 is attached. On top of a shaft 69*a* of the first pressure control cylinder 69, a hemispherical plate supporter 69*b* is provided for supporting a bottom surface 78*a* of a swingable plate 78 on which the wafer support plate 60 and the XYθ table 72 are held, by point contact.

The first pressure control cylinder 69 contracts such that an excess pressure can escape when the pressure of the first lifting actuator 66 in pressing the wafer 25 against the glass substrate 33 exceeds a predetermined value (for example 7 kgf). Note that the second and third lifting actuators 67, 68 have the structure same as the first lifting actuator 66, and the second and third pressure control cylinders 70, 71, which have the structure same as the first pressure control cylinder 69, are respectively attached to the second and third lifting actuators 67, 68.

Because the first to third lifting actuators 66-68 are positioned equiangularly at intervals of 120° around the center of the wafer support plate 60, the inclination of the wafer 25 can be adjusted in a balanced manner. In addition, because the first to third lifting actuators 66-68 are positioned at positions facing the edge of the wafer 25 set on the wafer support plate 60, the movement of the lifting actuators 66-68 can be effectively transmitted to the wafer 25. Therefore, short stroke actuators can be used as the lifting actuators 66-68.

The XYθ table 72 for moving the wafer support plate 60 in the X-axis direction, the Y-axis direction, and the rotational direction, comprises known ball screws, ball screw nuts, guide shafts, slide bearings and so on. The XYθ table 72 adjusts the positions of the wafer 25 and the glass substrate 33 by moving the wafer support plate 60.

Figure 10:
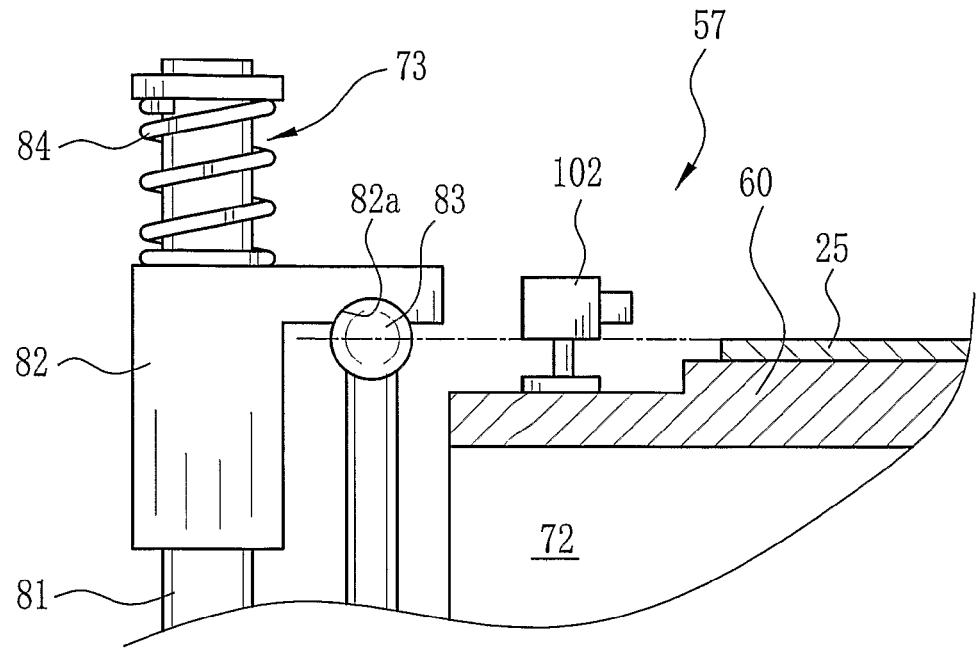
FIG. 10 is a partially sectional view showing a structure of a primary portion of a plate supporting mechanism.

As shown in FIG. 10 in close-up, the first plate supporting mechanism 73 comprises a guide shaft 81 provided on a frame 61*a* of the underside joining unit 61, a supporting arm 82 slidably inserted to the guide shaft 81, a spherical shaft 83 provided on the swingable plate 78, a spherical bearing 82*a* provided in the supporting arm 82 to contact the spherical shaft 83 with allowing rotation of the spherical shaft 83, and a spring 84 for biasing the supporting arm 82 downward. The center of the spherical shaft 83 is in a position coplanar with a joint surface of the wafer 25 positioned on the wafer support plate 60. Note that the second and third plate supporting mechanisms 74, 75 have the same structure as the first plate supporting mechanism 73. Therefore the detailed descriptions are omitted.

A vacuum pump 80, for vacuum sucking the wafer 25 or the glass substrate 33 through the wafer support plate 60, is provided among the first to third lifting actuators 66-68. The first to third lifting actuators 66-68, the XYθ table 72, and the vacuum pump 80 are controlled by the control computer 15. In the frame 61*a*, slide bearings 79 for guiding the shafts 69*a*, 77*a* are embedded.

When adjusting parallelism between the wafer 25 and the glass substrate 33 by the underside joining unit 61, the lifting actuators 66-68 are respectively driven according to result of parallelism measurement of the wafer 25 and the glass substrate 33, for moving the shaft 77*a* in vertical direction to adjust the height of the plate supporters 69*b*. When inclination of the swingable plate 78 according to the movement of the plate supporters 69*b*, the supporting arms 82 of the plate supporting mechanisms 73-75 push the spherical bearing 82*a* to the spherical shaft 83 by biasing of the spring 84. Accordingly, the swingable plate 78 swings from the spherical shaft 83, on the joint surface of the wafer 25, so as to adjust the inclination of the wafer 25. Therefore, misalignment in the horizontal direction of the wafer 25 in the parallelism adjustment is minimized.

In addition, when joining the wafer 25 and the glass substrate 33, the first to third lifting actuators 66-68 are driven in synchronization. The respective plate supporters 69*b* push the undersurface of the swingable plate 78 to move the wafer 25 upward to a joining position. Accordingly, the wafer 25 is pressed to the glass substrate 33 with keeping the inclination determined at the parallelism adjustment.

When joining the wafer 25 and the glass substrate 33, the wafer 25 follows the inclination of the held glass substrate 33, then the swingable plate 78 swings according to the rotation of the spherical shafts 83 of the respective plate supporting mechanisms 73-75. Because the swing of the swingable plate 78 is performed on the joint surface of the wafer 25, therefore misalignment of the joining position between the wafer 25 and the glass substrate 33 is minimized.

When the wafer 25 is pressed against the glass substrate 33 by the first to third lifting actuators 66-68, if the pressure of one or more of the lifting actuators 66-68 exceeds the predetermined value (for example 7 kgf by one lifting actuator), the one or more of pressure control cylinders 69-71 attached to the lifting actuator which exceeds the predetermined pressure value, contract such that the excess pressure escapes. Accordingly, the wafer 25 and the glass substrate 33 are prevented from being locally pushed too hard, which prevents problems of running off the adhesive 8 from under the each spacer 4 and breaking the wafer 25 and the glass substrate 33.

The topside joining unit 63 comprises the glass support plate 62, a plate supporting member 86 which has a crank-shaped cross section and supports the glass support plate 62, and a vacuum pump 87 for vacuum sucking the glass substrate 33 through the glass support plate 62. The glass support plate 62 is made of for example a circular disk of glass plate which has planarity and high load bearing capacity. The plate supporting member 86 is attached to a single axis robot 93 for the glass substrate which moves the plate supporting member 86 along the joining station 57, a transcribing station 91 and a peeling station 92 (see FIG. 3).

The glass support plate 62 is moved between the joining station 57 and the peeling station 92 and stopped for operation of each station, with holding the glass substrate 33. Accordingly, the glass substrate 33 is not need to be transferred between the joining station 57 and the transcribing station 91. Therefore, mechanisms and operations for transferring the glass substrate 33 can be cut. In addition, misalignment of the glass substrate 33 caused by transferring can be prevented.

The wafer 25 and the glass substrate 33 are lapped and joined with being held by the wafer support plate 60 and the glass support plate 62. Accordingly, the glass substrate 33 has to be held by the glass support plate 62 such that the surface on which the spacer 4 is provided faces the wafer 25 held on the wafer support plate 60. In other words, the glass substrate 33 has to be held such that the spacer 4 is directed downward. However, the glass substrate 33 is contained in the open cassette 35 with the spacer 4 being directed upward, and is transferred onto the alignment station 53 with keeping its direction. Accordingly, the glass substrate 33 is inversed with the suction hand 49 by rotating the fifth axis of the robot arm 48 of the five axis robot 47 (shown in FIG. 5), when the glass substrate 33 is transferred to the joining station 57 from the alignment station 53.

Figure 11:
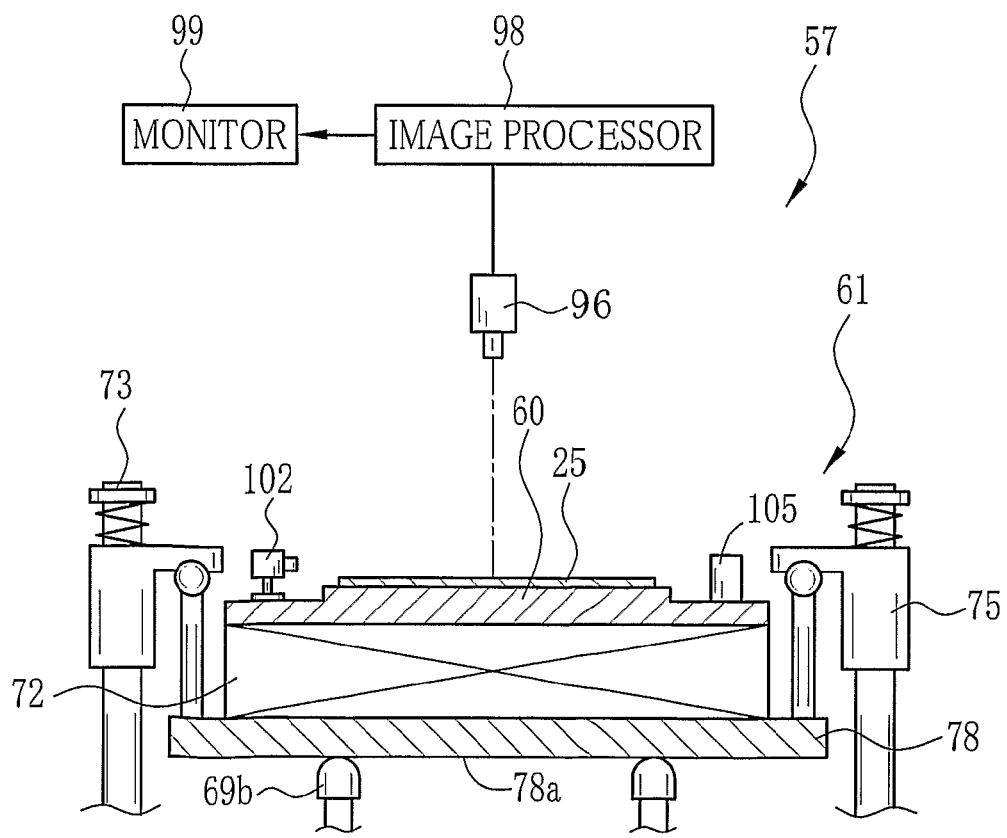
FIG. 11 is a partially sectional view showing a state of the joining station when measuring a position of the substrate.

As shown in FIG. 11, in a position above the joining station 57 where the topside joining unit 63 is not interfered, a substrate imaging camera 96, which images the glass substrate 33 or the wafer 25 held on the wafer support plate 60 when the topside joining unit 63 is not positioned above the underside joining unit 61, is provided. The substrate imaging camera 96 is operated for definitely positioning the glass substrate 33 or the wafer 25.

The image data of the glass substrate 33 or the wafer 25 taken by the substrate imaging camera 96 is inputted to an image processor 98. The image processor 98 calculates a position coordinate of the glass substrate 33 or the wafer 25 such that for example the inputted image data is processed to become a binary data. The position coordinate calculated by the image processor 98 is inputted to the control computer 15 for being compared with a prerecorded reference position. Then the XYθ table 72 is driven such that the glass substrate 33 or the wafer 25 is positioned at the reference position. Note that the image processed by the image processor 98 can be monitored by a monitor 99 provided outside of the clean booth 12.

Note that the substrate imaging camera 96 has two kinds of taking lenses, one has low magnification and the other has high magnification. When the lens of low magnification is used, whole of the glass substrate 33 or the wafer 25 is imaged, such that the position thereof is measured based on their outline. When the lens of high magnification is used, alignment marks provided on the wafer 25 and the glass substrate 33, the spacer 4, details of the image sensor 6 and so on are imaged so as to measure the position coordinate of the wafer 25 and the glass substrate 33.

As shown in FIG. 3, a substrate imaging camera 100 is provided between the joining station 57 and the transcribing station 91, for imaging the glass substrate 33 held by the glass support plate 62 before joining the glass substrate 33 and the wafer 25. When the substrate imaging camera 100 images the glass substrate 33, the topside joining unit 63 is positioned between the joining station 57 and the transcribing station 91, at a position where the substrate imaging camera 100 faces.

The image data of the glass substrate 33 taken by the substrate imaging camera 100 is inputted into the image processor 98 as same as the image data taken by the substrate imaging camera 96, for measurement of position of the glass substrate 33 on the glass support plate 62. Note that the glass support plate 62 has not a mechanism for adjusting position of the glass substrate 33. Therefore, the result of the position measurement of the glass substrate 33 performed just before the joining is used for adjusting the position of the wafer 25 on the wafer support plate 60.

Note that the position accuracy of the wafer 25 and the glass substrate 33 adjusted by the imaging cameras 96, 100 and the XYθ table 72 is, for example, ±0.005 mm in the X-axis direction and the Y-axis direction, and ±0.0002° in the rotational direction.

Figure 12:
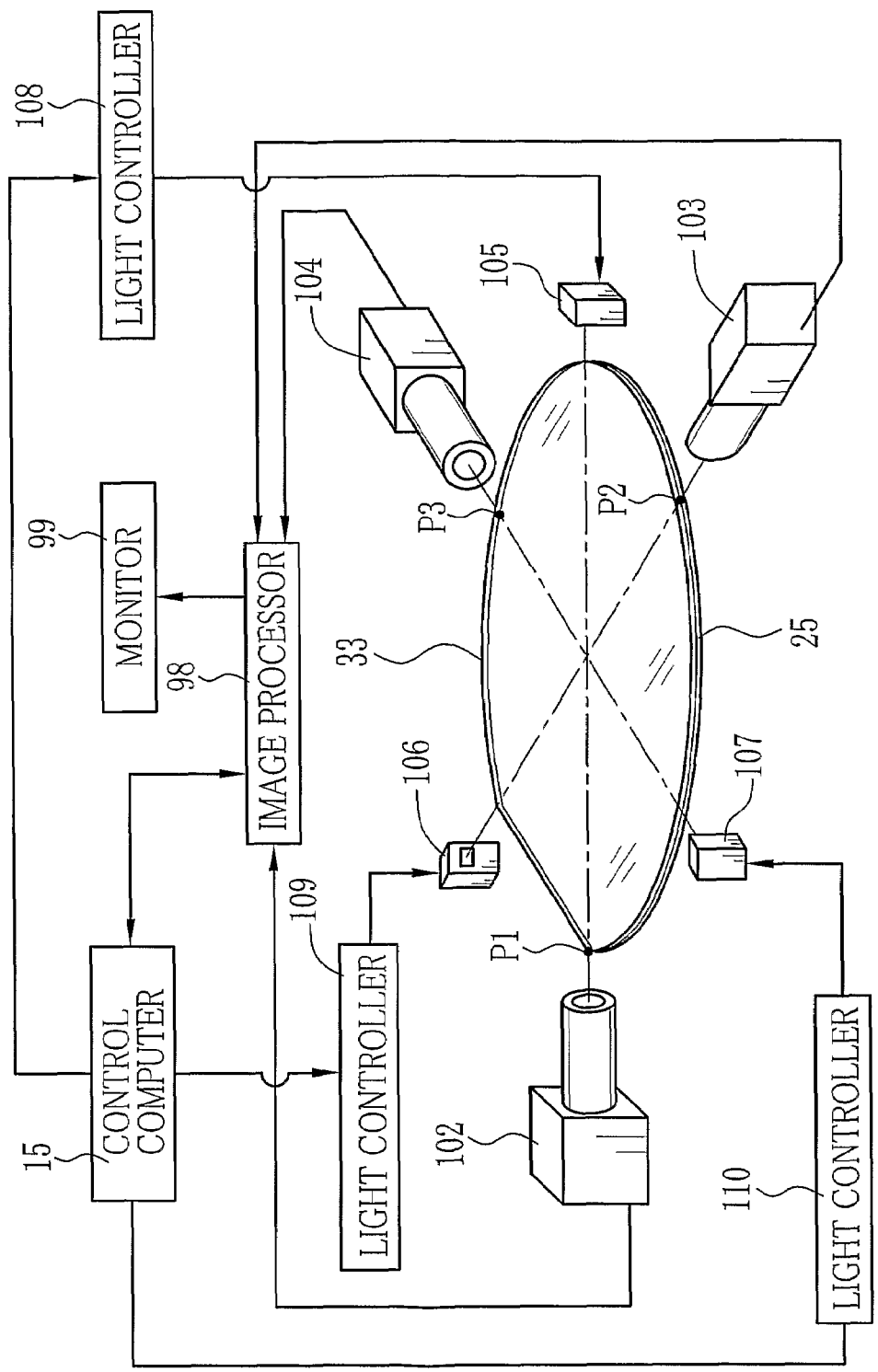
FIG. 12 is a schematic view showing arrangement of lights and imaging cameras for parallelism measurement.

As shown in FIG. 7, FIG. 8 and FIG. 12, on an outer peripheral portion of the upper surface of the wafer support plate 60, first to third clearance imaging cameras 102-104 for measuring parallelism of the joint surfaces of the wafer 25 and the glass substrate 33, and first to third lights 105-107 faced respectively to the first to third clearance imaging cameras 102-104 are arranged equiangularly. In this embodiment, the joint surface of the wafer 25 and the joint surface of the glass substrate 33 are arranged so as to make predetermined clearance S (for example S=1 mm), and the clearance between the joint surfaces are illuminated by the first to third lights 105-107 to be imaged by the first to third clearance imaging cameras 102-104. Then the parallelism is measured by calculating the length of the clearance between the wafer 25 and the glass substrate 33 obtained by the image data.

Figure 13:
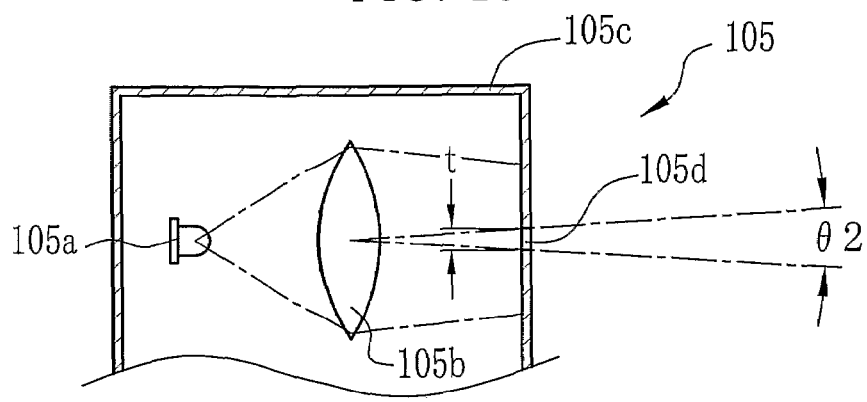
FIG. 13 is a partially sectional view showing a structure of the light.
Figure 14:
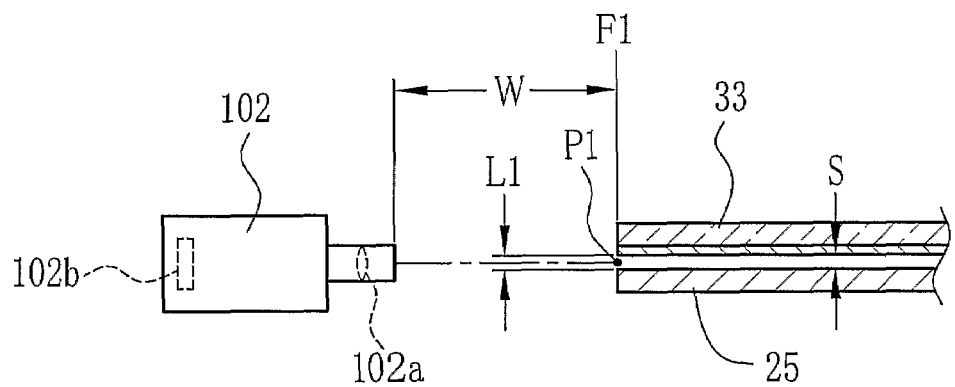
FIG. 14 is an explanatory view showing a positional relation between the substrate and the imaging camera.

The first to third lights 105-107 as transmission illuminating devices, are turned on by light controllers 108-110 controlled by the control computer 15. As shown in FIG. 13, the light 105 has a LED 105a as a light source. Lights emitted from the LED 105a are condensed by a condenser lens 105b, and restricted by a slit 105d formed on a case 105c of the first light 105, so as to be approximately parallel light which has a converging angle θ2 of 1° or less, for example 0.2°. When imaging the area between the wafer 25 and the glass substrate 33, there may be a problem of reflection noises which occur by the light emitted from the first light 105 being reflected by the joint surfaces of the substrates to enter to the imaging cameras. However, in this embodiment, the reflection noises are reduced such that the converging angle θ2 of the first light 105 is narrowed for reducing the reflection at the joint surfaces. Note that the second and third lights 106, 107 have a structure same as the first light 105, therefore detailed descriptions are omitted.

Focus positions of the transmissions from the lights 105-107 are on ends of the substrates where the transmission is emitted between the wafer 25 and the glass substrate 33, for example points P1-P3 shown in FIG. 12. These focus positions P1-P3 are positions which are imaged by the first to third clearance imaging camera 102-104.

The first clearance imaging camera 102 has a taking lens 102a and a solid state imaging device 102b such as a CCD, which images object lights entered through the taking lens 102a, so as to image the point P1 illuminated by the light 105. As the taking lens 102a, a telecentric lens in which only the parallel lights can enter. Accordingly, the reflection lights from the joint surfaces of the wafer 25 and the glass substrate 33 can hardly enter to the first clearance imaging camera 102. Therefore, the reflection noise can hardly affect the imaging. Note that the second and third clearance imaging cameras 103, 104 have a structure same as the first clearance imaging camera 102, therefore detailed descriptions are omitted.

Figure 15:
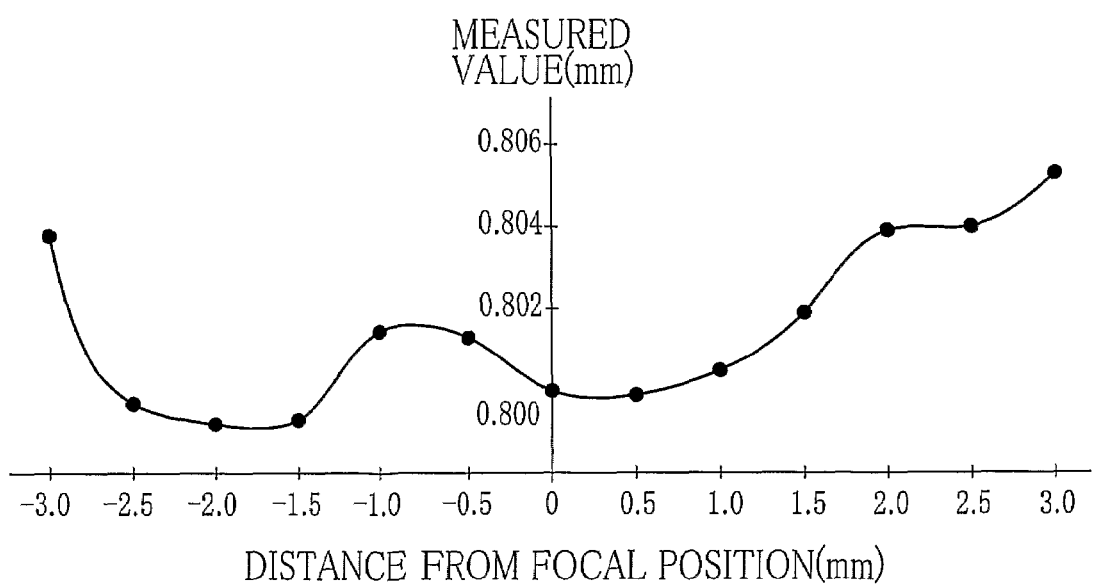
FIG. 15 is a graph showing a relation between a misalignment amount of the substrates from a focal point of the imaging camera and a measured value of distance between the wafer and the glass substrate.

A graph in FIG. 15 shows a relation between a distance between the point P1 and a focal point F1 of the first clearance imaging camera 102, and a measured value of the distance between the wafer 25 and the glass substrate 33. The measurement is performed at conditions that a distance W between the end of the taking Lens 102a and the focal point F1 is 65 mm, a focal depth of the taking lens 102a is 100 μm, a height t of the slit 105d is 1.2 mm and the clearance S between the wafer 25 and the glass substrate 33 is 0.8 mm.

The graph shows that when the converging angle of the first light 105 is narrowed and the telecentric lens is used as the taking lens 102a, difference of the measured value is reached only 2 μm even if the distance between the point P1 and the focal point F1 becomes few millimeters, for example over 1 mm (ten times larger than the depth of field). This is because the first clearance imaging camera 102 is hardly affected by the reflection noises even if the point P1 is apart from the focal point F1. Therefore, positioning of the wafer 25 and the glass substrate 33 against the first to third clearance imaging cameras 102-104 can be simplified.

The image data generated by the first to third clearance imaging cameras 102-104 is inputted into the image processor 98. The image processor 98 processes the image data to a binary data, and outputs the binary data to the control computer 15. The control computer 15 calculates a clearance L1 between the wafer 25 and the glass substrate 33 at the point P1, a clearance L2 at the point P2, and a clearance L3 at the point P3 (see FIG. 12).

The control computer 15 drives the first to third lifting actuators 66-68 based on the measured clearances L1-L3, so as to equalize the clearances at the points P1-P3, which are on the ends of the wafer 25 and the glass substrate 33. Accordingly, because the joint surfaces of the wafer 25 and the glass substrate 33 become parallel, it is prevented that the joining positions of the substrates are misaligned and the adhesive 8 is run off from the substrates in the joining. Note that the accuracy of adjusting the clearance between the wafer 25 and the glass substrate 33 by the first to third lifting actuator 66-68 is, for example, ±0.001 mm per the one point.

Beside the joining station 57, the transcribing station 91 for transcribing the adhesive on the spacers 4 on the glass substrate 33, a film supplying section 113 for supplying a transcribing film 112 which is pre-coated by the adhesive 8 to the transcribing station 91, and the peeling station 92 for peeling the transcribing film 112 from the glass substrate 33 are arranged.

In the transcribing station 91, the transcribing film 112 and the glass substrate 33 are laminated and pressurized. Then in the peeling station 92, the transcribing film 112 is peeled off from the glass substrate 33, such that the layer of the adhesive 8 is formed on the spacer 4 by transcribing. According to the transcribing, the adhesive 8 can be coated on the spacer 4 with thin and constant thickness. Therefore, it is prevented that the excessive adhesive 8 runs onto the image sensor 6 or defective joining occurs. In addition, a yield ratio of the product can be increased because the adhesive 8 is not dripped onto the glass substrate 33 in coating.

Figure 16:
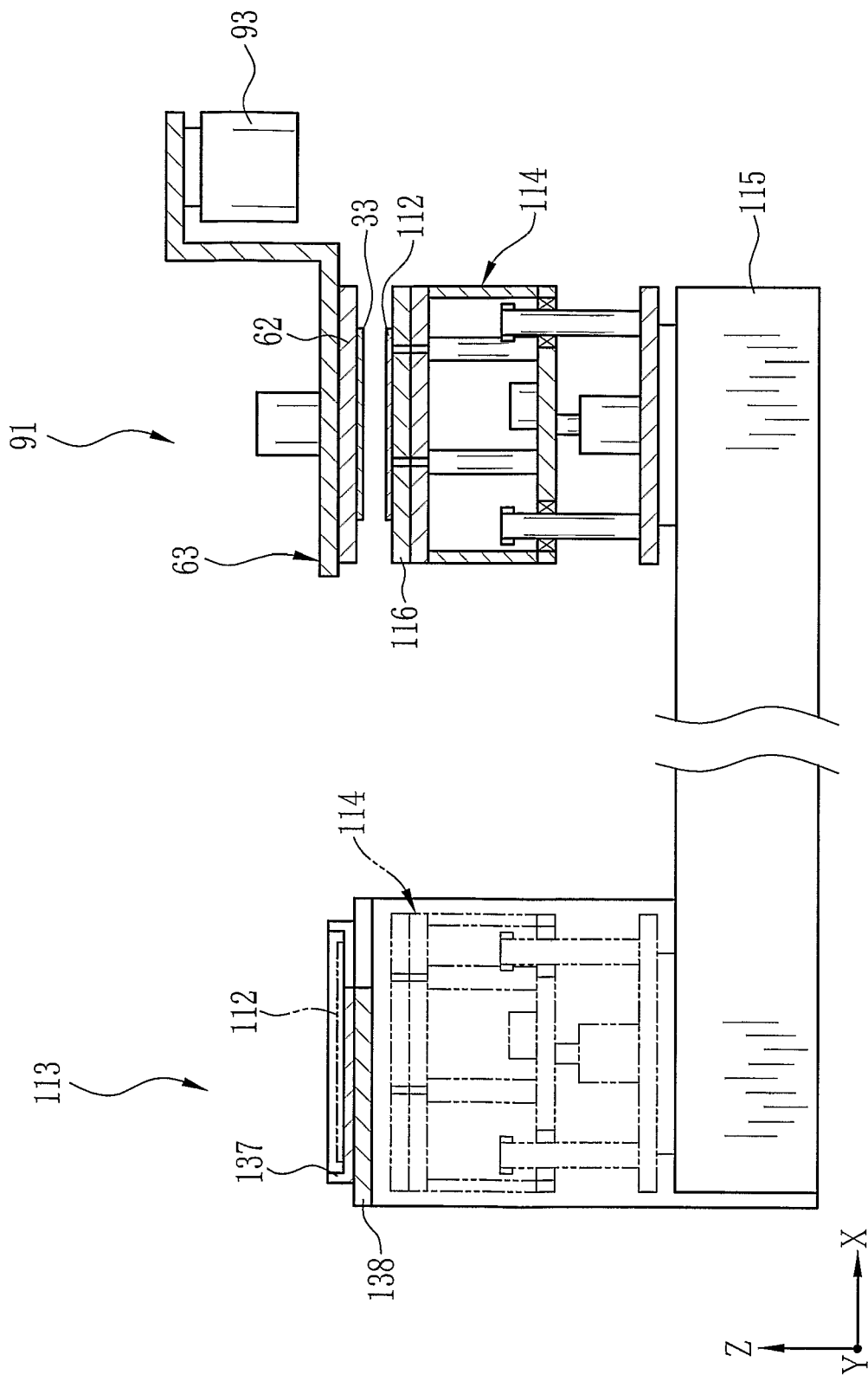
FIG. 16 is an explanatory view showing positional relationship between a transcribing station and a film supplying section.

As shown in FIG. 16, in the transcribing station 91, a transcribing unit 114, which can move between a film receiving position for receiving the transcribing film 112 from the film supplying section 113, and a transcribing standby position where the transcribing film 112 faces the glass substrate 33 held by the topside joining unit 63 at the transcribing station 91, is provided. The transcribing unit 114 is moved by a single axis robot 115 for transcribing provided between the transcribing station 91 and the film supplying section 113.

Figure 17:
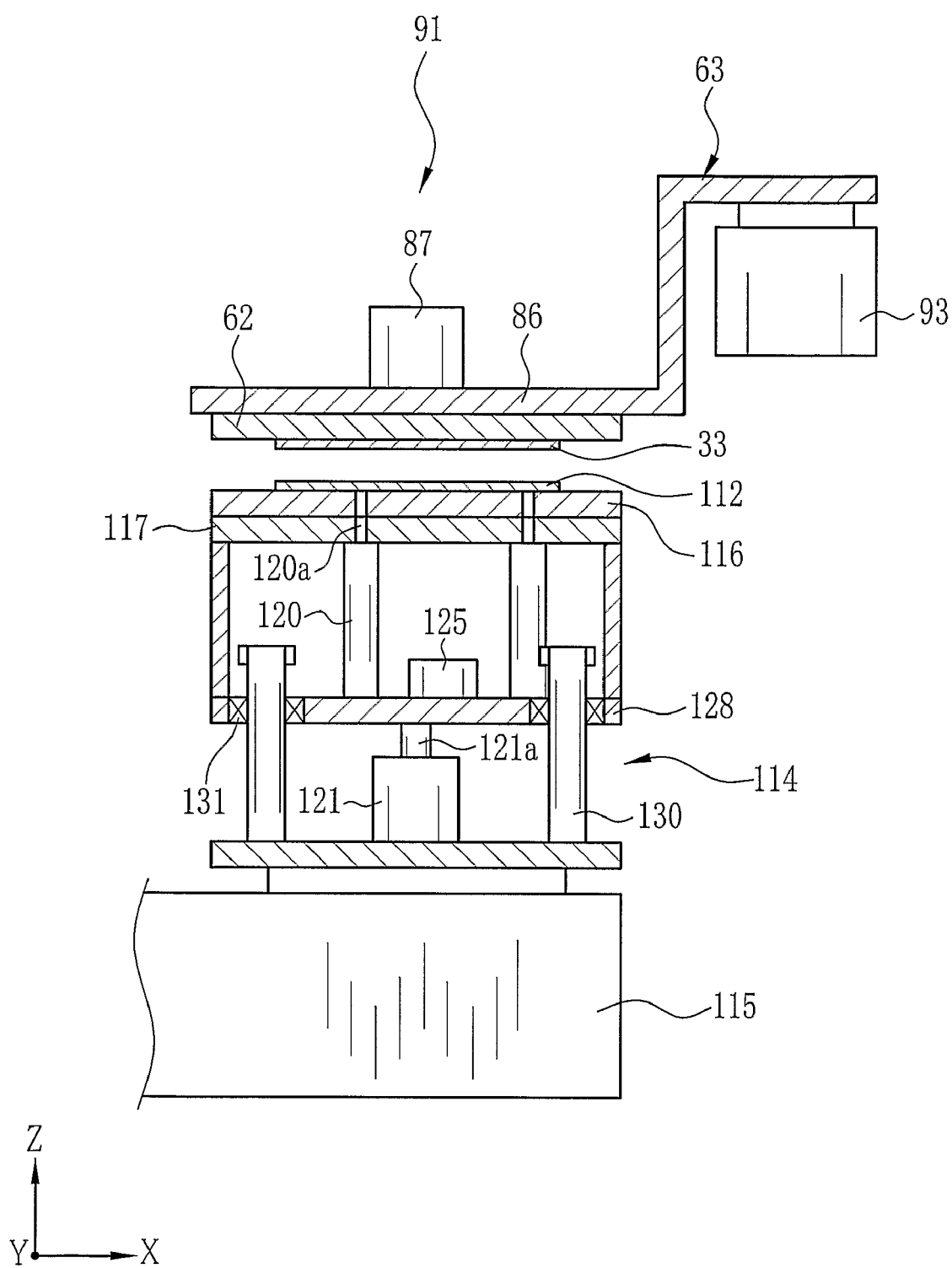
FIG. 17 is a partially sectional view showing a structure of the transcribing station.

As shown in FIG. 17, in the transcribing unit 114, a plate for transcribing 116 which holds the transcribing film 112 received from the film supplying section 113 by vacuum sucking, and sticks the transcribing film 112 to the glass substrate 33 held by the glass support plate 62, is provided. As the plate for transcribing 116, a plate-like cushion is used for increasing degree of adhesion between the transcribing film 112 and the glass substrate 33. In addition, the plate for transcribing 116 is set on a backing board 117 formed of a metal plate such as stainless which has planarity, so as to have planarity.

For the cushion used for the plate for transcribing 116, a material for example sponge rubber which has low degree of hardness and a low-dusting skin surface or the like is preferable. In particular, for example silicon sponge rubber or the like which has hardness of ASKER-C 20-40 (SRIS (The Society of Rubber Industry, Japan Standard)) is preferable.

In the transcribing unit 114, for example three transferring actuators 120 for transferring the transcribing film 112 from the film supplying section 113 to the plate for transcribing 116, and a pressurization actuator 121 for moving the plate for transcribing 116 up and down and overlapping and pressurizing the glass substrate 33 held by the glass support plate 62 and the transcribing film 112, are provided.

The three transferring actuators 120 are incorporated under the backing board 117, and arranged equiangularly around the center of the plate for transcribing 116. Each of the transferring actuators 120 projects a plunger 120a upward when the transcribing unit 114 is moved to the film receiving position, so as to handle the transcribing film 112 in the film supplying section 113 by uplifting the transcribing film 112 with holding undersurface thereof. The transferring actuators 120 are controlled by the control computer 15. Note that a vacuum pump 125, for vacuum sucking the transcribing film 112 to hold it on the plate for transcribing 116, is provided among the three actuators 120.

Figure 18:
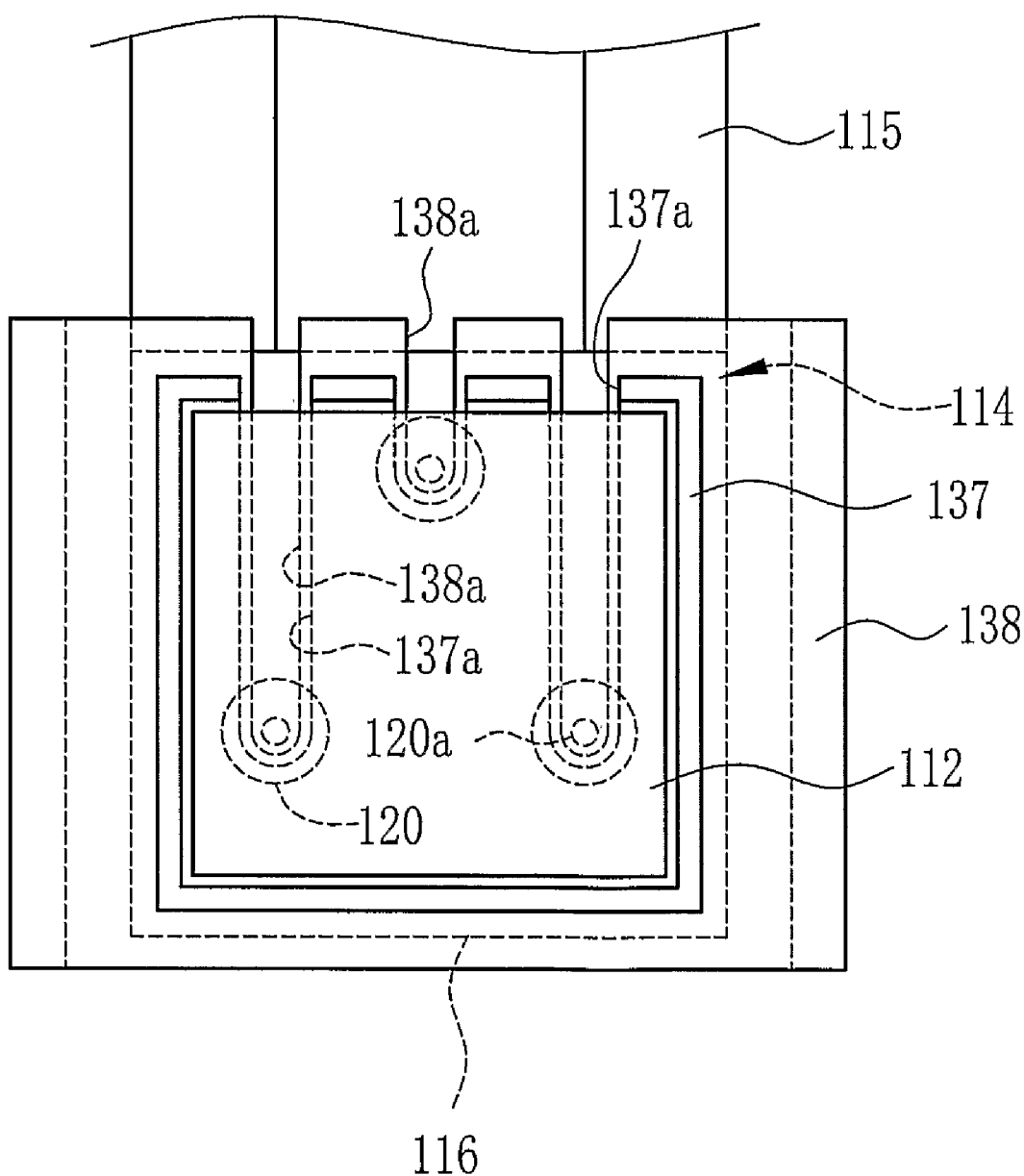
FIG. 18 is a top view of the film supplying section.

On the side wall of the clean booth 12, an opening 134 is formed at a position where the film supplying section 113 faces. And a door 135 is provided for opening and closing the opening 134. In the film supplying section 113, a holder 138 on which a film case having a shape like a tray which contains the transcribing film 112 is provided. As shown in FIG. 18, in the holder 138 and the film case 137, three slits 138a, 137a are respectively formed for allowing the plunger 120a of the transferring actuators 120 being inserted in there, when transferring the transcribing film 112 from the film case 137 to the plate for transcribing 116.

Figure 19A:
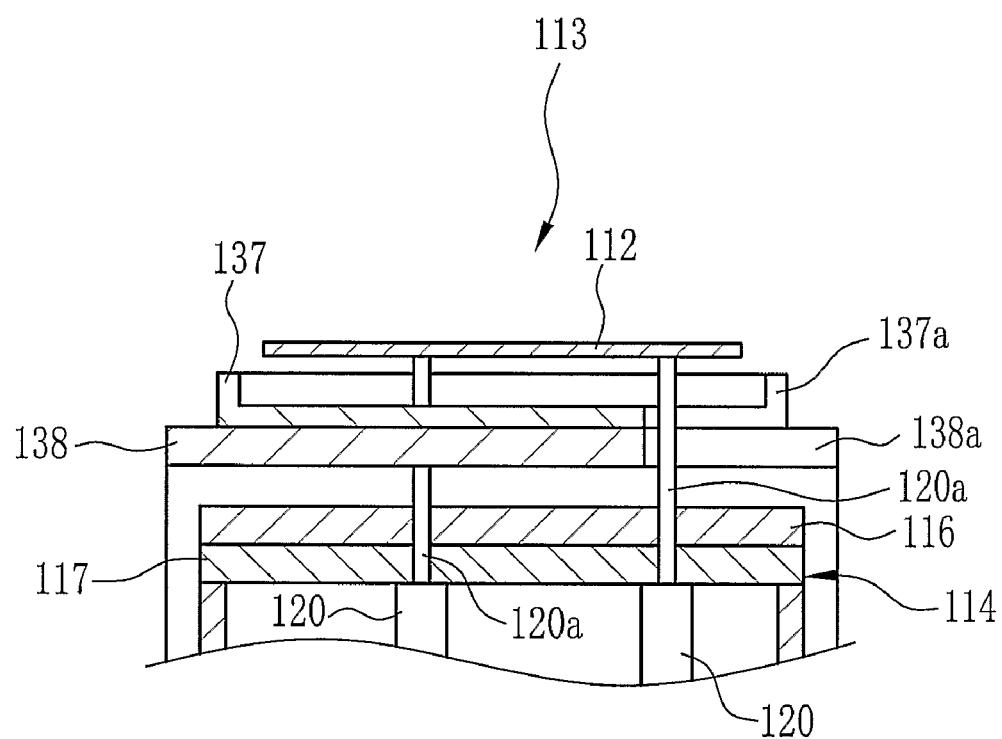
FIGS. 19A, 19B are partially sectional views showing a transcribing film on a transcribing unit.
Figure 19B:
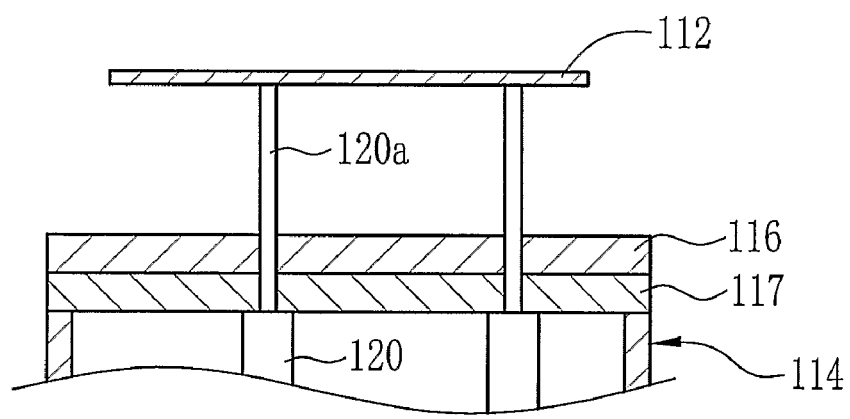

As shown in FIG. 19A, when the transcribing unit 114 is moved under the holder 138 of the film supplying section 113 by the single axis robot 115 for transcribing, each of the plunger 120a of the three transferring actuators 120 is projected upward, so as to enter the slits 137a, 138a which are respectively provided by three and lift up the transcribing film 112. Next, as shown in FIG. 19B, the transcribing unit 114 is moved from under the holder 138 and then temporary stopped by the single axis robot 115 for transcribing. At this time, each of the plungers 120a of the three transferring actuators 120 is moved downward so as to set the transcribing film 112 on the plate for transcribing 116, as shown in FIG. 17.

Note that because the transferring actuator 120 has a plunger which is thin, a large hole for plunger is not required in the plate for transcribing 116. Therefore, the pressurization of the transcribing film 112 and the glass substrate 33 by the plate for transcribing 116 is prevented from adverse influence of the hole.

Figure 20:
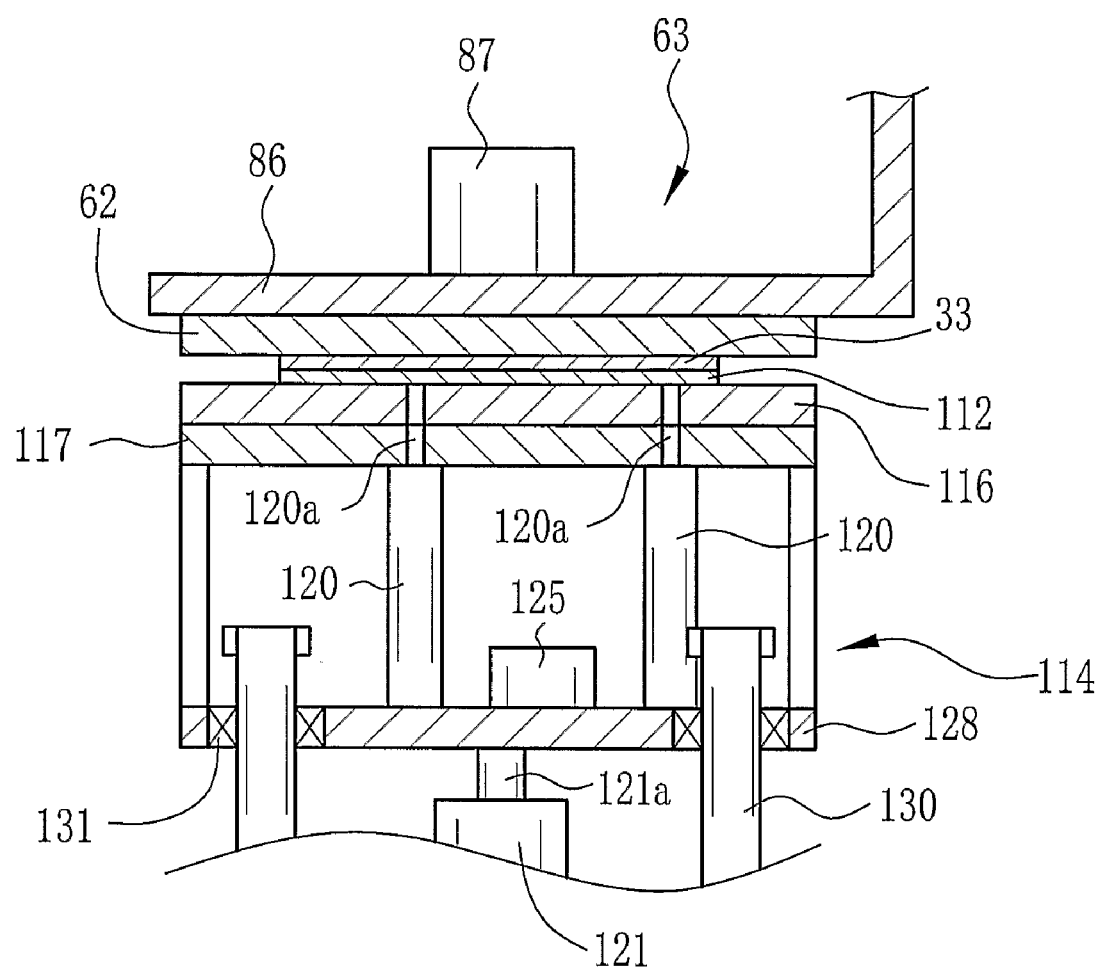
FIG. 20 is a partially sectional view showing a state of the transcribing station when joining the transcribing film and the glass substrate.

As shown in FIG. 20, the pressurization actuator 121 moves a plunger 121a upward so as to press a frame 128 on which the three transferring actuators 120 are attached. Accordingly, the plate for transcribing 116 is moved upward to a transferring position and pushes the transcribing film 112 to the glass substrate 33 held by the glass support plate 62 for transferring the adhesive 8 to the each spacer 4. Note that pressure of the plate for transcribing 116 in pressurization of the glass substrate 33 and the transcribing film 112 is, for example, 20 kgf.

Around the pressurization actuator 121, plural guide shafts 130 for guiding movement of the frame 128, and slide bearings 131 attached to the frame 128 for guiding slide of the guide shaft 130, are provided. The pressurization actuator 121 is controlled by the control computer 15.

Figure 21A:
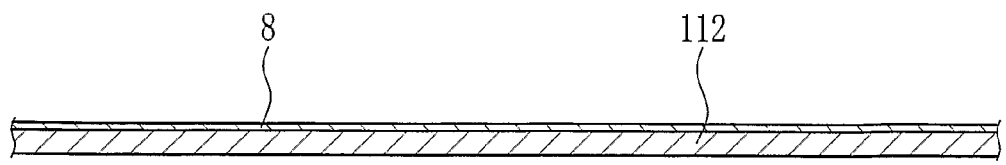
FIGS. 21A-21D are explanatory views showing processes for joining the wafer and the glass substrate.

As shown in FIG. 21A, the transcribing film 112 is a thin film evenly formed from, for example, polyethylene terephthalate (PET), which has elasticity for allowing to be bended and a size larger than a diameter of the glass substrate 33. The adhesive 8 is coated on the transcribing film 112 by for example a bar coater, a spin coater or a blade coater. The transcribing film 112 on which the adhesive 8 is coated is contained in the film case 137. Note that if static electricity is caused on the transcribing film 112, the static electricity adversely affects handling of the transcribing film 112. Therefore, antistatic treatment is applied on the transcribing film 112.

As general characteristic of the adhesive, it is known that wettability for inorganic material such as silicon becomes worse when its viscosity is low, and the wettability becomes improved when its viscosity is high. However, if the adhesive having high viscosity is used, it becomes difficult to control coating thickness of the adhesive on the transcribing film 112. Therefore, in this embodiment, normal temperature curable adhesive is used as the adhesive 8, for increasing its viscosity by leaving the transcribing film 112 in the film case 137 for predetermined period. Hereinafter, the viscosity controlling with time is called as time process.

Because the viscosity of the adhesive 8 becomes high when the adhesive 8 is transcribed on the spacer 4, the adhesive 8 becomes harder to flow out. Therefore, the transcribing film 112 and the glass substrate 33 on which the adhesive 8 is transcribed become easier to be handled. In addition, the adhesive 8 running off from under the spacer 4 can be reduced when the pressurization of the glass substrate 33 and the wafer 25. Note that when hydrophilic adhesive is used, the spacer 4 can be applied surface reforming by irradiation of plasma or ultraviolet lay. By the surface reforming process, the wettability of the adhesive for the spacer 4 formed from silicon can be improved.

Figure 22:
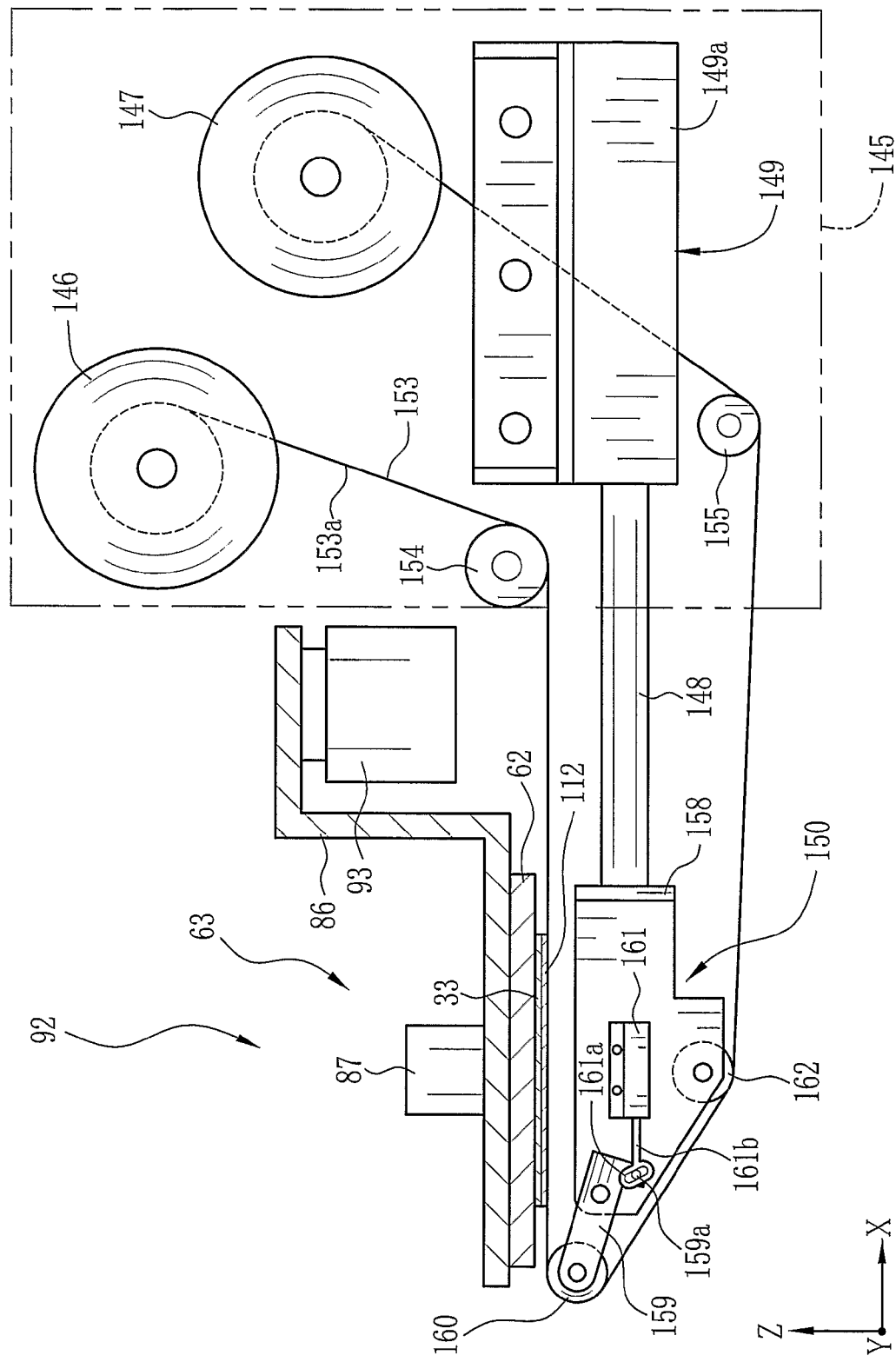
FIG. 22 is a schematic view showing a structure of a peeling station.

As shown in FIG. 22, the peeling station 92 comprises a base 145 standing along vertical direction, a feeding reel 146 and a winding reel 147 which are rotatably held by the base 145, a peeling actuator 149 attached to the base 145 for moving a plunger 148 in the X-axis direction, and a peeling unit 150 attached to the plunger 148.

In the feeding reel 146, an unused adhesive tape 153, wound such that an adhesive surface 153a is directed inside, is set. A long adhesive tape 153 drawn from the feeding reel 146 is hanged on a guide roller 154 provided on the base 145, the peeling unit 150 and a guide roller 155, and connected to the winding reel 146. The winding reel 146 is rotated in counterclockwise direction by a motor (not shown) so as to wind the used adhesive tape 153 and the transcribing film 112 peeled off from the glass substrate 33 by adhering to the adhesive tape 153.

The adhesive tape 153 between the guide roller 154 and the peeling unit 150 adheres to the transcribing film 112 such that the adhesive surface 153a faces the glass support plate 62 which holds the glass substrate 33 on which the transcribing film 112 is adhered. The width of the adhesive tape 153 is, for example, 75 mm.

The peeling unit 150 comprises a base plate 158 attached to top of the plunger 148, a swing arm 159 swingably attached to the base plate 158, a peeling roller 160 rotatably attached to top of the swing arm 159 for hanging the adhesive tape 153, an actuator for swing 161 having a slot 161a for linking to a pin 159a formed in one end of the swing arm 159, and a guide roller for guiding the adhesive tape 153.

The actuator for swing 161 of the peeling unit 150 swings the swing arm 159 by movement of a plunger 161b in which the slot 161a is formed, so as to move the peeling roller 160 attached on the top of the swing arm 159 among a retract position, an adhesion position and a peeling position. The peeling roller 160 is moved to the retract position when the glass support plate 62 is moved to the peeling station 92.

Figure 23A:
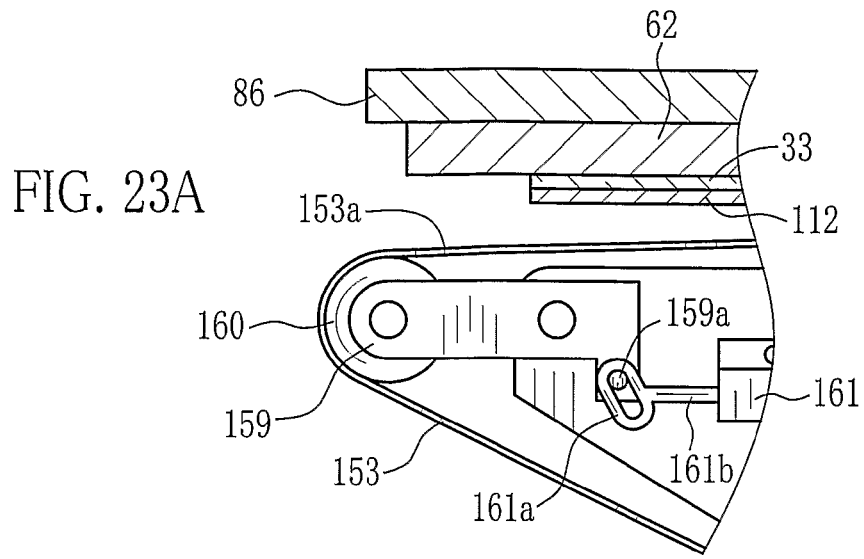
FIGS. 23A-23C are explanatory views showing stop positions of a peeling roller.

As shown in FIG. 23A, the retract position of the peeling roller 160 is apart from the transcribing film 112. When the peeling roller 160 is at the retract position, the adhesive tape 153 hanged between the peeling roller 160 and the guide roller 154 is also apart from the transcribing film 112. Accordingly, it is prevented that the adhesive tape 153 contacts to the transcribing film 112 when the glass support plate 62 is moved to the peeling station 92.

Figure 23B:
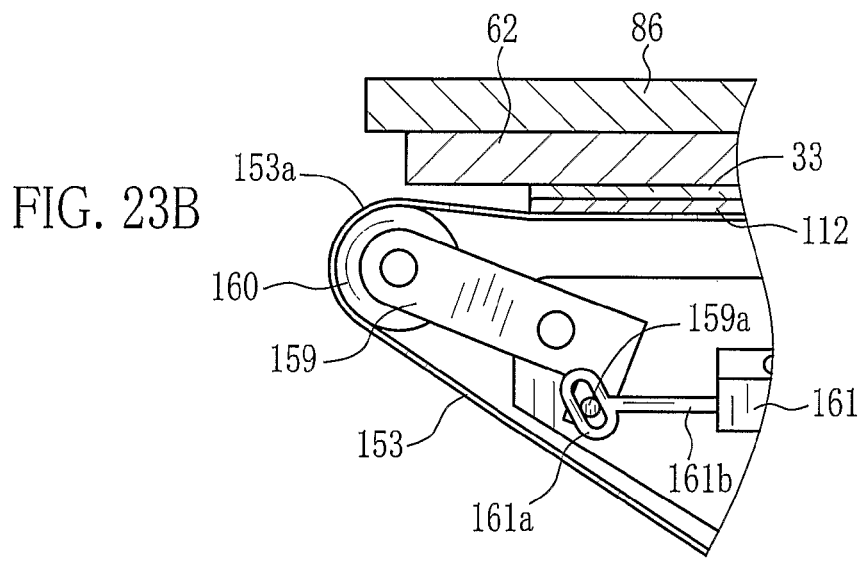

As shown in FIG. 23B, the peeling roller 160 is moved to the adhesion position for attaching the adhesive tape 153 to the transcribing film 112. When the peeling roller 160 is moved to the adhesion position, the adhesive surface 153a of the adhesive tape 153 hanged on the peeling roller 160 is moved to a position higher than undersurface of the transcribing film 112. Therefore, the adhesive tape 153 hanged between the peeling roller 160 and the guide roller 154 is certainly adhered on the transcribing film 112.

Figure 23C:
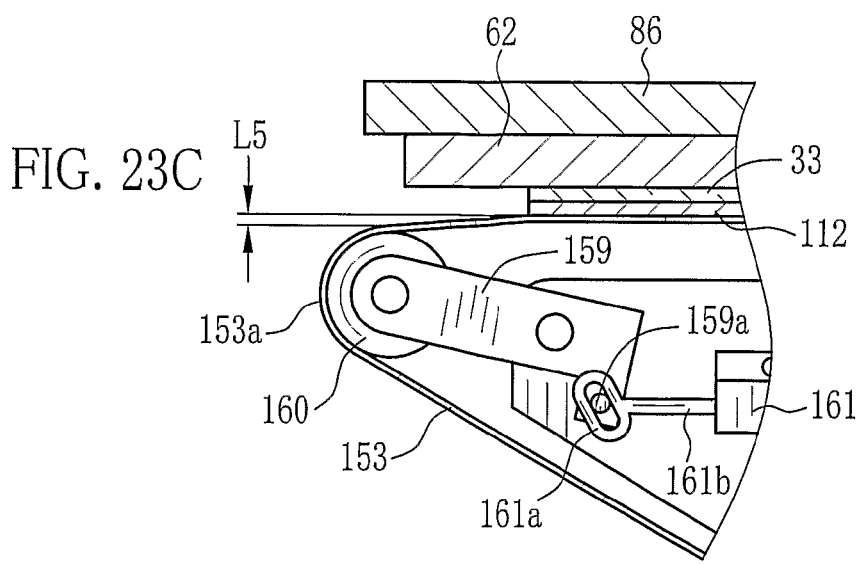

As shown in FIG. 23C, the peeling roller 160 is moved to the peeling position for peeling the transcribing film 112 from the glass substrate 33. When the peeling roller 160 is set to the peeling position, a clearance L5 is formed between the adhesive surface 153a of the adhesive tape 153 hanged on the peeling roller 160 and the undersurface of the transcribing film 112. Accordingly, the peeling roller 160 does not press the transcribing film 112 when the peeling roller 160 peels off the transcribing film 112 with moving rightward in the figure. Therefore, it is prevented that the adhesive 8 runs off.

Figure 24:
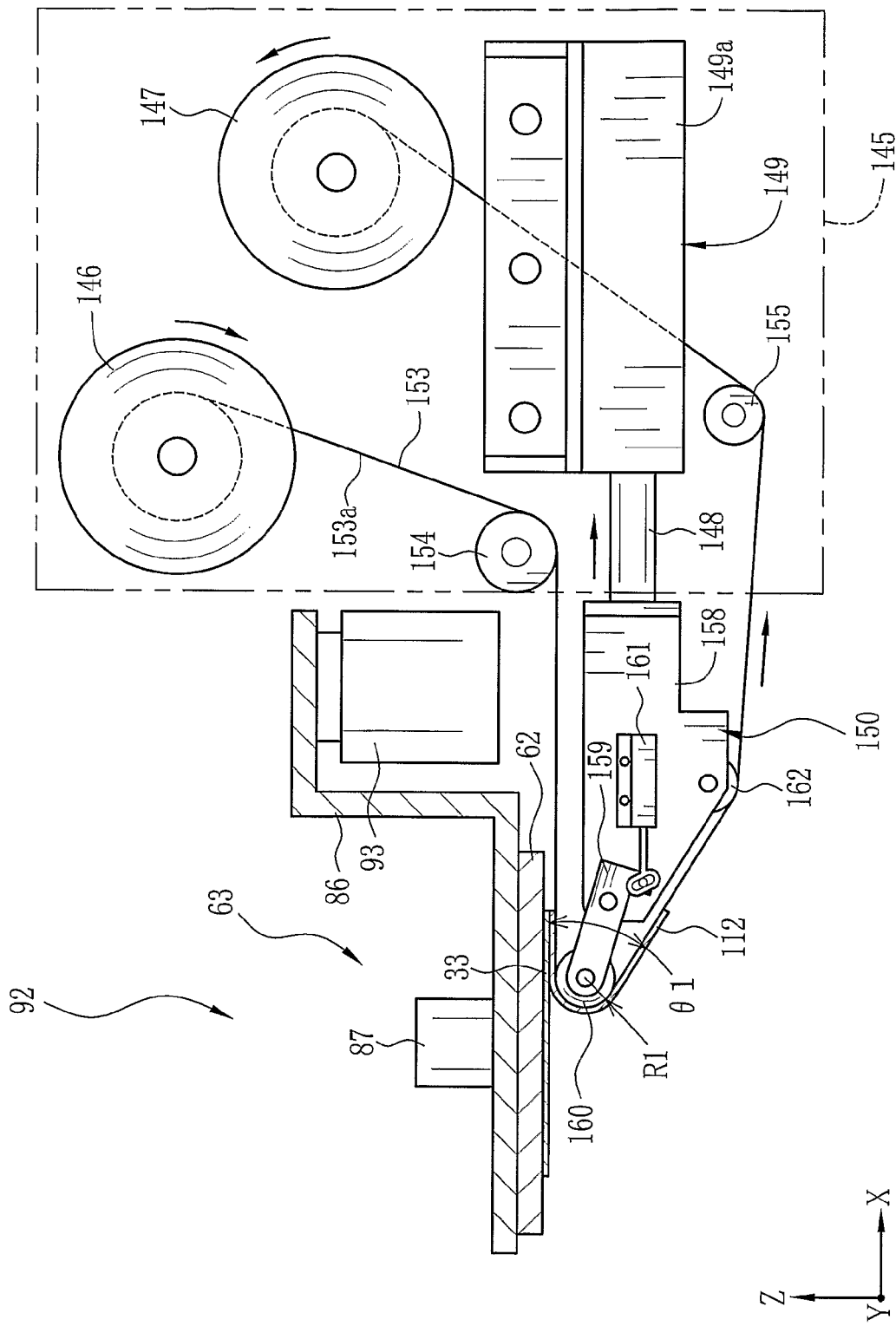
FIG. 24 is a schematic view showing a state of the peeling station in peeling the transcribing film.

As shown in FIG. 24, the peeling actuator 149 is pulling the plunger 148 back in a housing 149a at a constant speed when the peeling roller 160 is set at the peeling position from the adhesion position. At the same time, the winding reel 146 is rotated in the counterclockwise direction. Accordingly, the transcribing film 112 adhered to the glass substrate 33 is rolled up to be peeled off from top end thereof by the adhesive tape 153. The used adhesive tape 153 and the peeled transcribing film 112 can be ejected from an opening 167 by opening a door 166 on the side wall of the clean booth 12.

A curvature of the transcribing film 112 is kept constant while the peeling operation because the curvature is determined by a radius R1 of the peeling roller 160. In addition, a peeling angle θ1 of the transcribing film 112 against the joint surface of the glass substrate 33 is determined by relative positions of the peeling roller 160 and a guide roller 162, which do not vary because these members are moved together. Accordingly, peeling condition between the transcribing film 112 and the glass substrate 33 is kept constant. Therefore, it is prevented that a membrane of the adhesive 8 are generated between the glass substrate 33 and the transcribing film 112, and the membrane bursts to mess the glass substrate 33.

Note that it is preferable that the clearance L5 is, for example, below 0.1 mm. If the clearance becomes larger, the curvature of the transcribing film 112 becomes substantially larger than the radius of the peeling roller 160 while the peeling operation. Accordingly, the clearance L5 is preferably determined as a value not to generate the membrane of the adhesive 8, with considering the radius of the peeling roller 160.

In addition, the curvature of the transcribing film 112 in the peeling operation can be adjusted by changing the peeling roller 160 for another one which has different diameter. When changing the peeling roller 160, the retract position, the adhesion position and the peeling position of the peeling roller 160 are also need to be adjusted. However, these positions can be easily adjusted by controlling the projection length of the plunger 161b of the actuator for swing 161.

Figure 25:
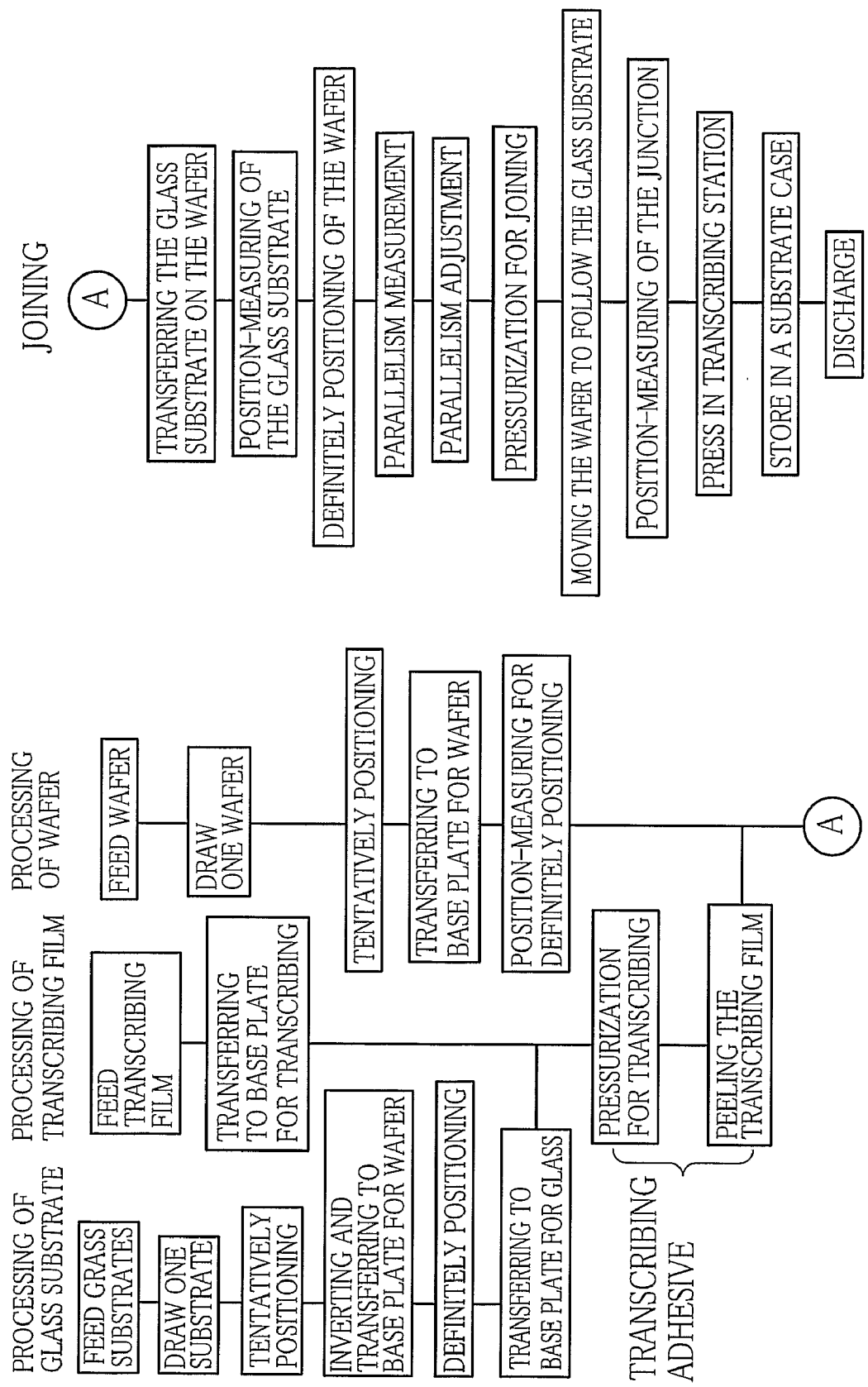
FIG. 25 is a flow chart describing steps of operation of the device for joining substrates.

Next, an operation of the above embodiment is explained with referring to a flow chart of FIG. 25. The single axis robot 46 shown in FIG. 3 moves the five axis robot 47 to the glass substrate receiving position. The five axis robot 47 draws the one glass substrate 33 from the open cassette 35 of the glass substrate supplying section 34, and set the glass substrate 33 on the alignment station 53 such that the surface on which the spacers 4 are formed directs upward. The alignment station 53 performs the tentatively positioning of the glass substrate 33 in the rotational direction, the X-axis direction and the Y-axis direction.

The glass substrate 33 to which the tentatively positioning is completed is draw from the alignment station 53 by the five axis robot 47. The single axis robot 46 moves the five axis robot 47 to the joining position with the five axis robot 47 inversing the suction hand 49 by the fifth axis 50e such that the surface of the glass substrate 33 on which the spacers 4 are formed directs downward. The five axis robot 47 at the joining position sets the glass substrate 33 on the wafer support plate 60 of the underside joining unit 61 of the joining station 57. The wafer support plate 60 holds the glass substrate 33 by vacuum sucking.

After setting the glass substrate 33 on the joining station 57, the five axis robot 47 is moved to the wafer receiving position, the alignment position and the joining position in sequence by the single axis robot 46, so as to transfer the wafer 25 from the open cassette 28 of the wafer supplying section 26 to the joining station 57 through the alignment station 53. In the alignment station 53, the tentatively positioning of the wafer 25 is performed as same as the tentatively positioning of the glass substrate 33. Because the wafer 25 and the glass substrate 33 are handled by the robots in the clean booth, it is prevented that foreign matters stick to the substrates.

When the glass substrate 33 or the wafer 25 is set on the joining station 57, as shown in FIG. 16, the topside joining unit 63 is moved to the transcribing station 91 by the single axis robot 93 for the glass substrate. Therefore, as shown in FIG. 11, no member is inserted between the underside joining unit 61 and the substrate imaging camera 96 such that the definitely positioning of the substrates can be performed with using the substrate imaging camera 96.

The substrate imaging camera 96 images the glass substrate 33 and outputs the image data to the image processor 98. The image processor 98 processes the inputted image data to generate binary data, and outputs the binary data to the control computer 15. The control computer 15 calculates the position of the glass substrate 33 based on the binary data, and compares the calculated position to the preinstalled reference position. Then the control computer 15 drives the XYθ table 72 according to the difference between the calculated position and the reference position of the glass substrate 33 so as to move the wafer support plate 60 such that the glass substrate 33 is positioned on the reference position.

After positioning the glass substrate 33, the topside joining unit 63 is moved to the joining station 57 by the single axis robot 93 for the glass substrate. As shown in FIG. 9, the underside joining unit 61 drives the first to third lifting actuators 66-68 in synchronization to move the wafer support plate 60 upward to the joining position such that the glass substrate 33 contacts to the glass support plate 62. Then the glass support plate 62 starts vacuum sucking and the wafer support plate 60 stops vacuum sucking, therefore the glass substrate 33 is transferred from the wafer support plate 60 to the glass support plate 62. The topside joining unit 63 which holds the glass substrate 33 is moved to the transcribing station 91 again, and the wafer support plate 60 is moved downward to the retract position.

The five axis robot 47 takes the wafer 25 which completes the tentatively positioning from the alignment station 53 and set the wafer 25 on the wafer support plate 60. The wafer 25 is held on the wafer support plate 60 by vacuum sucking, and is measured its position in the same method applied to the glass substrate 33, for performing the definitely positioning.

As shown in FIG. 16 as double-dashed lines, the transcribing unit 114 of the transcribing station 91 is moved to the film receiving position by the single axis robot 115 for transcribing, and set under the holder 138 of the film supplying section 113 as shown in FIG. 18. As shown in FIG. 19A, the transcribing unit 114 drives the three transferring actuators 120 in synchronization, such that the plungers 120a project upward to elevate the transcribing film 112 from the film case 137.

As shown in FIG. 19B, the transcribing unit 114 moves from under the holder 138 of the film supplying section 113 with the three transferring actuators 120 upholding the transcribing film 112. Then the plungers 120a of the three transferring actuators 120 are moved downward to set the transcribing film 112 on the plate for transcribing 116. The transcribing film 112 is held on the plate for transcribing 116 by vacuum sucking. Because the transferring of the transcribing film 112 is performed in the clean booth 12 without manual operation, it is prevented that foreign matters stick to the transcribing film 112. In addition, the antistatic treatment is applied on the transcribing film 112, therefore it is prevented that the static electricity adversely affects handling of the transcribing film 112.

Figure 21B:
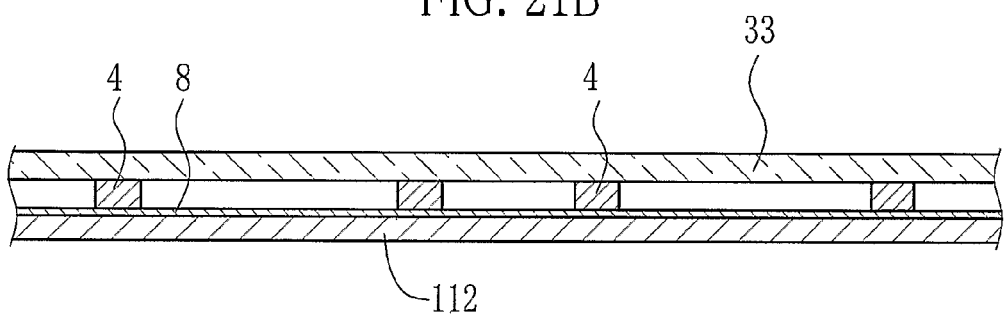

The transcribing unit 114 which holds the transcribing film 112 by vacuum sucking, moves to the transcribing standby position of the transcribing station 91. Then as shown in FIG. 20, the plate for transcribing 116 is moved upward to the transferring position by the pressurization actuator 121, and as shown in FIG. 21B, the transcribing film 112 is pressed against the glass substrate 33 held on the glass support plate 62 such that the adhesive 8 is transcribed to the each spacer 4. After a predetermined time is passed, the plate for transcribing 116 is moved downward to be returned to the transcribing standby position. At that time, vacuum sucking of the transcribing film 112 are stopped for adhering the transcribing film 112 to the glass substrate 33. Note that because the transcribing film 112 is pressed against the glass substrate 33 through the cushion, the adhesive 8 can be appropriately adhered on the spacer 4 without running off from the spacer.

As shown in FIG. 22, the topside joining unit 63 which holds the glass substrate 33 and the transcribing film 112 is moved to the peeling station 92 by the single axis robot 93 for the glass substrate. Note that as shown in FIG. 23A, the peeling roller 160 is moved downward to the retract position at that time, therefore the transcribing film 112 does not contact the adhesive tape 153.

After the movement of the topside joining unit 63 toward the peeling station 92 is completed, the peeling station 92 drives the actuator for swing 161 to swing the swing arm 159 to move the peeling roller 160 to the adhesion position shown in FIG. 23B such that the adhesive surface 153$a$ of the adhesive tape 153 adheres to the transcribing film 112. Next, the actuator for swing 161 moves the peeling roller 160 to the peeling position shown in FIG. 23C such that the clearance L5 is formed between the adhesive surface 153$a$ of the adhesive tape 153 hanged on the peeling roller 160 and the under surface of the transcribing film 112.

Figure 21C:
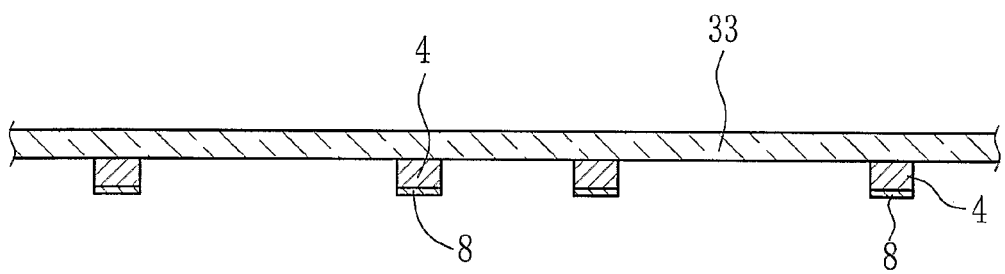

As shown in FIG. 24, the peeling station 92 drives the peeling actuator 149 to move the peeling unit 150 rightward in the figure, and the winding reel 146 winds the adhesive tape 153 in synchronization with the movement of the peeling unit. Accordingly, the transcribing film 112 adhered to the glass substrate 33 is rolled up to be peeled off from top end thereof by the adhesive tape 153, such that the layer of the adhesive 8 is formed on the each spacer 4 by the transcribing as shown in FIG. 21C.

The curvature and angle of the transcribing film 112 is kept constant while the peeling operation by the radius R1 of the peeling roller 160 and the peeling angle θ1 determined by the relative positions of the peeling roller 160 and the guide roller 162. Therefore, it is prevented that the membrane of the adhesive 8 are generated between the glass substrate 33 and the transcribing film 112, and the membrane bursts to mess the glass substrate 33. In addition, because the viscosity of the adhesive 8 is properly controlled by the time process, the wettability for the spacer 4 and the thickness of the layer of the adhesive 8 transcribed on the spacer 4 can become adequate.

Because the long adhesive tape 153 is used for peeling the transcribing film 112, the transcribing film 112 is easily and less costly held without complicated mechanisms. Also, because the peeled transcribing film 112 can be wound with the used adhesive tape 153, complicated mechanisms or devices for processing the peeled transcribing film 112 are not required. In addition, because the new adhesive tape 153 can be supplied at once after the used adhesive tape 153 is wound, efficiency of production of the solid state imaging device is improved.

The topside joining unit 63 which holds the glass substrate 33 having the spacers 4 coated by the adhesive 8 is moved toward the joining station 57 by the single axis robot 93 for the glass substrate, and is stopped at a position where the substrate imaging camera 100 faces. The substrate imaging camera 100 images the glass substrate 33 held by the glass support plate 62 and outputs the image data to the image processor 98. The image processor 98 generates the binary data by image processing, and outputs the binary data to the control computer 15. The binary data is used as a reference for performing the definitely positioning of the wafer 25 against the glass substrate 33.

After the topside joining unit 63 reached to the joining station 57, the definitely positioning of the wafer 25 is performed based on the result of the position measurement of the wafer 25 preformed before and the result of the position measurement of the glass substrate 33 performed by the substrate imaging camera 100. Accordingly, the wafer 25 can be joined with glass substrate 33 without misalignment.

Figure 26:
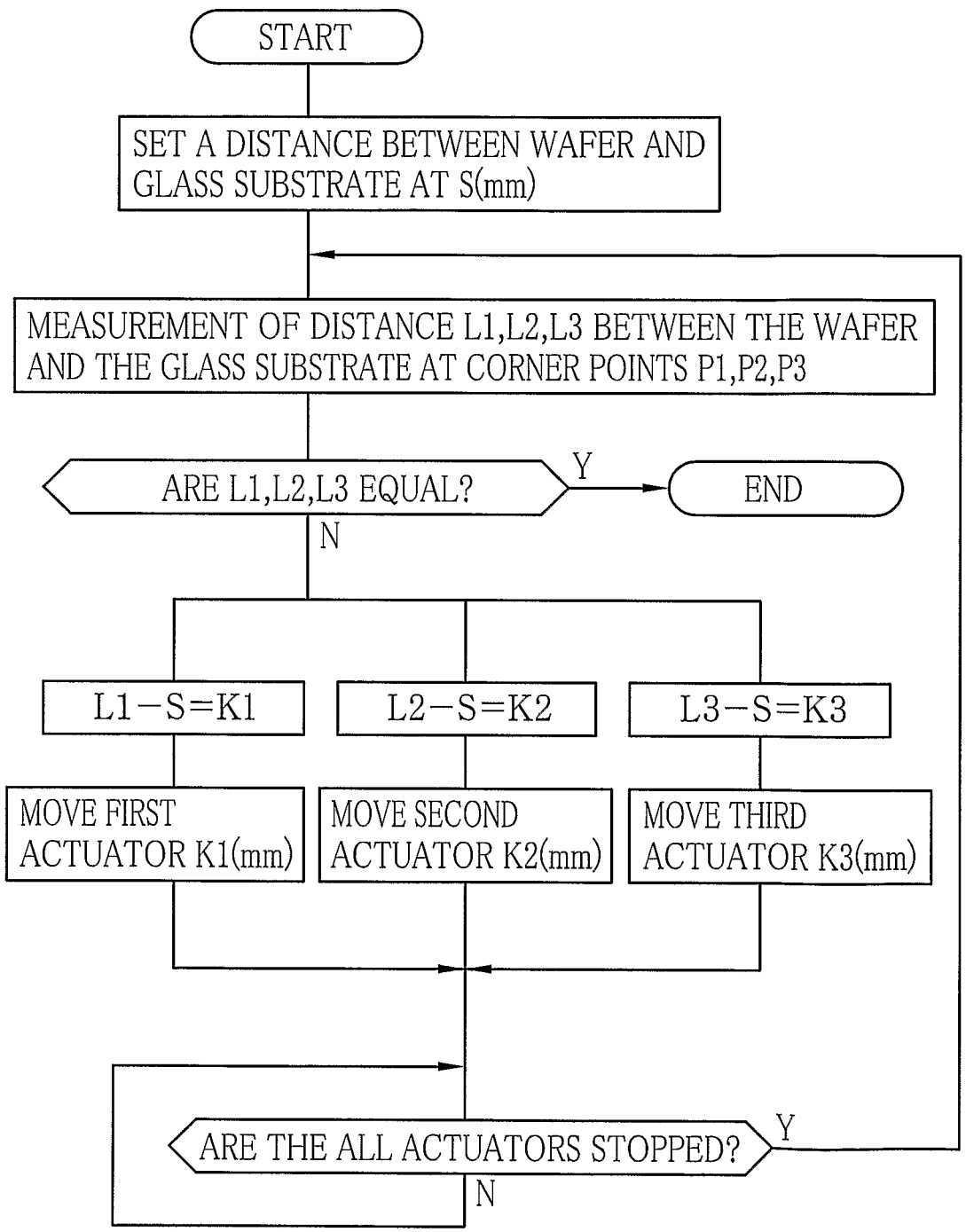
FIG. 26 is a flow chart describing steps of parallelism adjustment.

After adjusting the position of the wafer 25, parallelism adjustment between the wafer 25 and the glass substrate 33 is performed as shown in FIG. 26. As shown in FIG. 7, in the joining station 57, the first to third lifting actuators 66-68 are actuated in synchronization to elevate the wafer support plate 60 on which the wafer 25 is set and stop the elevation at a position where the distance S between the wafer 25 and the glass substrate 33 becomes for example 1 mm.

Next, the first to third lights 105-107 are turned on to illuminate the points P1-P3 between the ends of the wafer 25 and the glass substrate 33. The first to third clearance imaging cameras 102-104 positioned to face the first to third lights 105-107 image the clearances at the points P1-P3. The image data from the respective clearance imaging cameras 102-104 are inputted into the image processor 98. The image processor 98 processes the image data to generate the binary data, and outputs the binary data to the control computer 15. The control computer 15 calculates the clearances L1-L3 at the points P1-P3 based on the binary data.

If the clearances L1-L3 are equal, the parallelism measurement is completed without performing the parallelism adjustment because the joint surfaces of the wafer 25 and the glass substrate 33 are parallel. If the clearances L1-L3 are not equal, the parallelism between the wafer 25 and the glass substrate 33 needs to be adjusted.

The control computer 15 calculates declinations K1-K3 against the predetermined clearance S between the wafer 25 and the glass substrate 33, by subtracting the clearance S from the respective measured clearances L1-L3. Then the first to third lifting actuators 66-68 are respectively actuated according to the calculated declinations K1-K3, so as to equalize the clearances L1-L3. After completing the parallelism adjustment, the clearances L1-L3 is measured again with using the first to third lights 105-107 and the first to third clearance imaging cameras 102-104.

The parallelism measurement and the parallelism adjustment are repeated until the measured clearances L1-L3 become equal. Therefore, the parallelism between the wafer 25 and the glass substrate 33 can be adjusted with high accuracy. Further, because the parallelism measurement is performed without contacting the wafer 25 to the glass substrate 33, the wafer 25 and the glass substrate 33 cannot be messed. In addition, because the adjusting the inclination of the wafer 25 is performed in the parallelism adjustment such that the swingable plate 78 is swung on the joint surface of the wafer 25 by the first to third plate supporting mechanisms 73-75, the wafer 25 is not misaligned in horizontal direction when the parallelism adjustment is performed.

After the parallelism adjustment, the first to third lifting actuators 66-68 are actuated in synchronization to move the wafer 25 upward to the joining position where the wafer 25 contacts to the glass substrate 33, with keeping the inclination of the wafer 25 adjusted by the parallelism adjustment. The wafer 25 which is pressed to the glass substrate 33 follows the inclination of the glass substrate 33 such that the wafer support plate 60 is swung by the first to third plate supporting mechanisms 73-75. Because the swing of the wafer support plate 60 is preformed on the joint surface the wafer 25, misalignment caused between the joining positions of the wafer 25 and the glass substrate 33 can be minimized. Note that if the pressure of the first to third lifting actuators 66-68 exceeds the predetermined value, the first to third pressure control cylinders 69-71 contract such that the excess pressure escapes. Accordingly, the wafer 25 is prevented from being locally pushed too hard, which prevents problems of running off the adhesive 8 from under the each spacer 4 and breaking the wafer 25.

After passing the predetermined time from joining the wafer 25 and the glass substrate 33, the first to third lifting actuators 66-68 move the wafer support plate 60 downward to the retract position. At that time, the wafer support plate 60 stops vacuum sucking for the wafer 25. Accordingly, the wafer 25 joined with the glass substrate 33 is held by the glass support plate 62. Then the topside joining unit 63 moves the joined substrate 39 formed by joining the wafer 25 and the glass substrate 33 toward the transcribing station 91, and stops the movement at the position where the substrate imaging camera 100 faces.

The substrate imaging camera 100 images the joined substrate 39 held by the topside joining unit 63 and outputs the image data to the control computer 15. The control computer 15 processes the image data to generate the binary data, and calculates the alignment of the joining positions of the wafer 25 and the glass substrate 33. If there is misalignment of the wafer 25 or the glass substrate 33, the control computer 15 memorizes that the joined substrate 39 is defective, so as not to send the defective substrate to manufacturing lines followed after the device for joining substrates 11.

After completing the position measuring of the junction by the substrate imaging camera 100, the topside joining unit 63 is moved to the transcribing station 91 and is pressed by the plate for transcribing 116 formed of the cushion. Accordingly, the wafer 25 and the glass substrate 33 are more tightly joined.

After completing the pressurization of the joined substrate 39 at the transcribing station 91, the joined substrate 39 is moved to the joining station 57 by the topside joining unit 63, and set on the wafer support plate 60. Next, the joined substrate 39 is conveyed from the wafer support plate 60 to the joined substrate discharging section 40 by the five axis robot 47, so as to be contained in the substrate case 41. The joined substrate 39 is ejected from the clean booth 12 with being contained in the substrate case 41, and fed to a dicer.

Figure 21D:
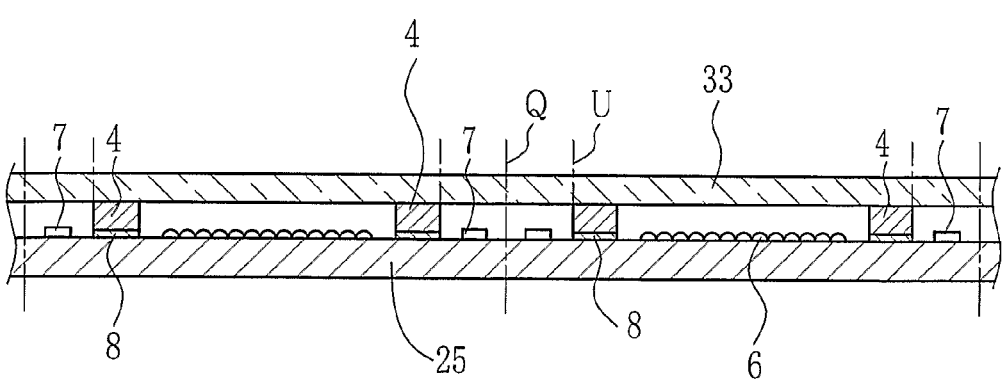

The dicer having a metal-resin bonding blade including diamond abrasive dices the wafer 25 and the glass substrate 33 joined with the wafer 25 along dicing lines Q and U shown as dashed lines in FIG. 21D, with cooling the joined substrate 39 by coolant water. Accordingly, a plurality of the solid state imaging devices 2 is produced by the one operation.

Figure 27:
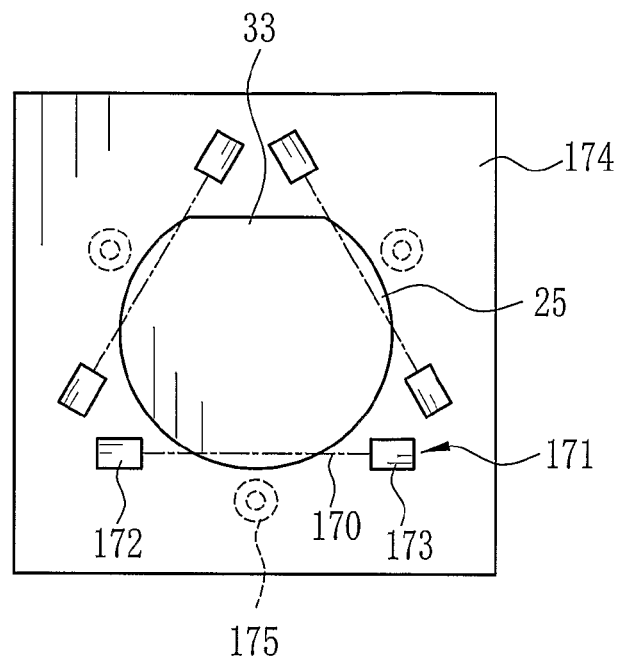
FIG. 27 is a top view showing an embodiment which uses contour measurement devices for parallelism measurement.

In the above embodiment, the first to third clearance imaging cameras 102-104 and the first to third lights 105-107 are used as substrate clearance measurement section for measuring the parallelism between the wafer 25 and the glass substrate 33. However, as shown in FIG. 27, three contour measurement devices 171 using laser beam 170 can be used as the substrate clearance measurement section. The contour measurement devices 171 emits the laser beam 170 from a light emitting section 172 to a light receiving section 173, such that the laser beam 170 passes between the wafer 25 and the glass substrate 33. Then the clearance between the wafer 25 and the glass substrate 33 is measured such that distances of the wafer 25 and the glass substrate 33 from the laser beam 170 are detected. Note that in case using the contour measurement device 171, three lifting actuators 175 may be used for adjusting an inclination of a wafer support plate 174.

Figure 28:
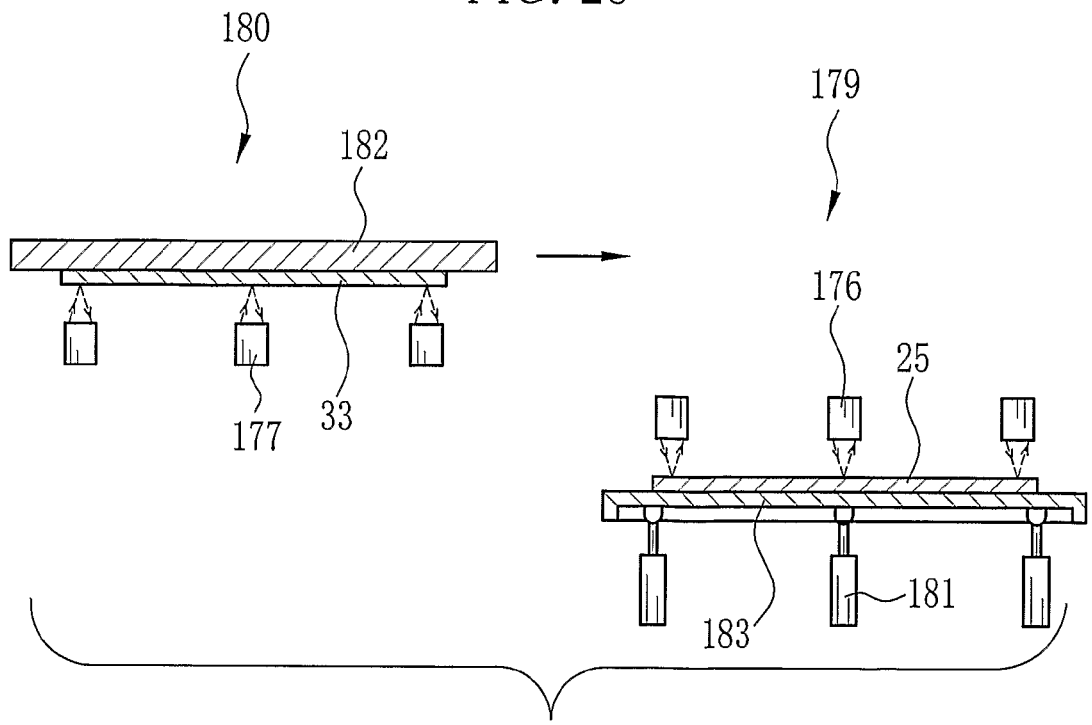
FIG. 28 is a partially sectional view showing an embodiment which uses laser displacement gauges for the parallelism measurement.

In the above embodiments, the parallelism between the wafer 25 and the glass substrate 33 are measured by detecting the distance between the wafer 25 and the glass substrate 33. However, as shown in FIG. 28, the parallelism between the wafer 25 and the glass substrate 33 can be measured such that laser displacement gauges 176, 177 measures plural positions of the joint surfaces of the wafer 25 and the glass substrate 33 in vertical direction and these measured position are compared to preset reference positions.

In this case, displacement amount of the joint surface of the wafer 25 is measured in a joining station 179, and displacement amount of the joint surface of the glass substrate 33 is measured in a measurement station 180 provided next to the joining station 179. Based on the displacement amounts of the joint surfaces of the substrates, lifting actuators 181 of the joining station 179 are actuated to adjust the inclination of the wafer 25. Then a glass support plate 182 is moved to the joining station 179 and the lifting actuators 181 lifts a wafer support plate 183 such that the wafer 25 is joined with the glass substrate 33.

Figure 29A:
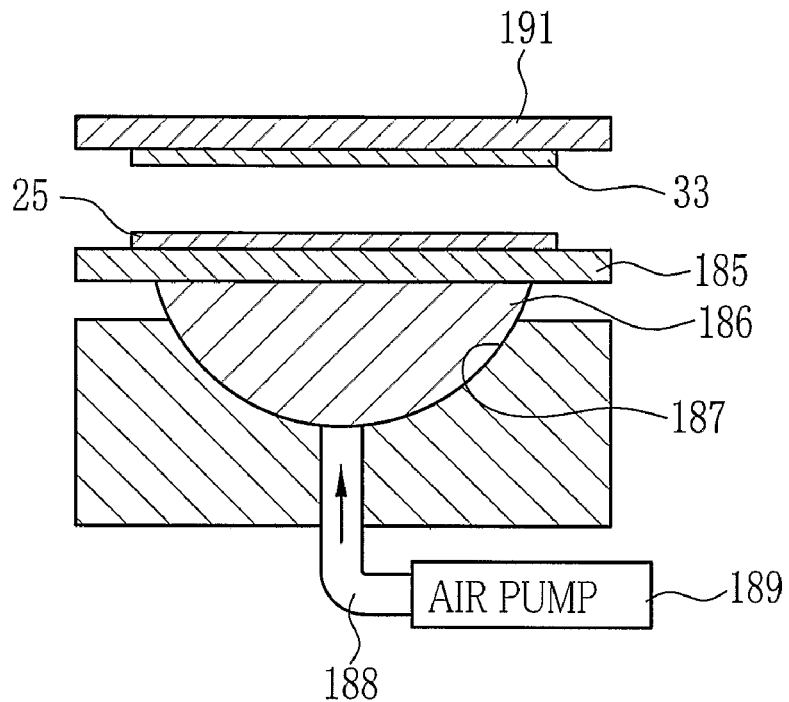
FIGS. 29A, 29B are partially sectional views showing an embodiment which adjusts the parallelism such that the wafer and the glass substrate contact to each other.

In the above embodiments, the parallelism adjustment is performed with measuring the clearance or the displacement amount of the joint surfaces of the wafer 25 and the glass substrate 33. However, the inclinations of the substrates can be adjusted such that the one substrate contacts to the other substrate to follow the inclination of the other substrate. For example, as shown in FIG. 29A, a spherical shaft 186 is attached on an undersurface of a wafer support plate 185 which holds the wafer 25. The spherical shaft 186 is rotatably received by a spherical receiver 187.

To the spherical receiver 187, one end of an air pipe 188 is connected and an air pump 189 is connected another end of the air pipe. When the air pump 189 sends air in the spherical receiver 187, frictional force between the spherical shaft 186 and the spherical receiver 187 becomes low for allowing movement of the wafer support plate 185. When the air pump 189 sucks the air in the spherical receiver 187, the spherical shaft 186 tightly contacts to the spherical receiver 187 to hold the wafer support plate 185 not to move.

Figure 29B:
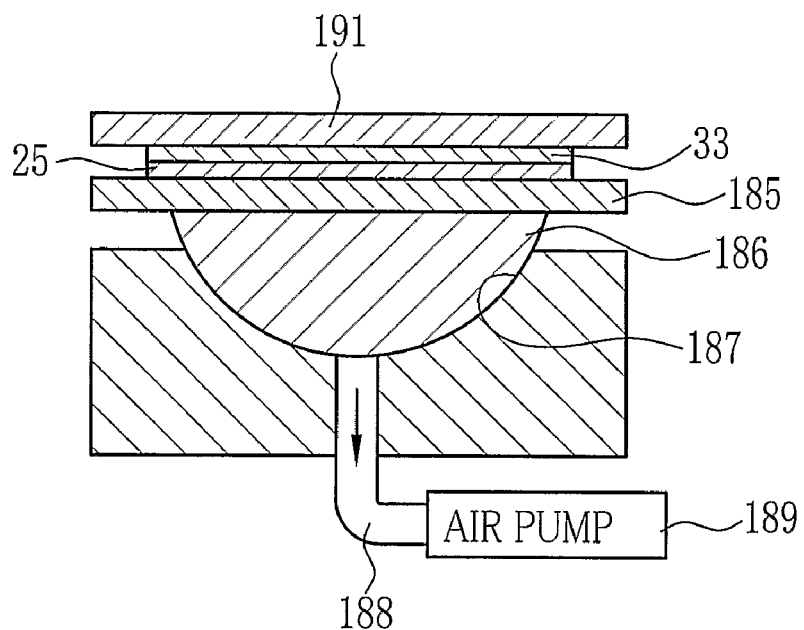

First, the air pump 189 sends air in the spherical receiver 187 for allowing movement of the wafer support plate 185. Next, as shown in FIG. 29B, the glass substrate 185 held on a glass support plate 191 contacts to the wafer 25 set on the wafer support plate 185. Accordingly, the wafer support plate 185 is moved such that the wafer 25 follows the inclination of the joint surface of the glass substrate 33. After that, the air pump 189 sucks the air in the spherical receiver 187 to hold the wafer support plate 185 not to move. Then the wafer 25 and the glass substrate 33 are set apart with keeping the inclinations of the wafer 25 and the glass substrate 33 in adjusted state. Finally, the adhesive is coated on the spacers 4 on the glass substrate 33 for joining between the wafer 25 and the glass substrate 33. Because the parallelism between the joint surfaces the wafer 25 and the glass substrate 33 are correctly adjusted at this time, the adhesive does not run off from the spacer 4.

Figure 30:
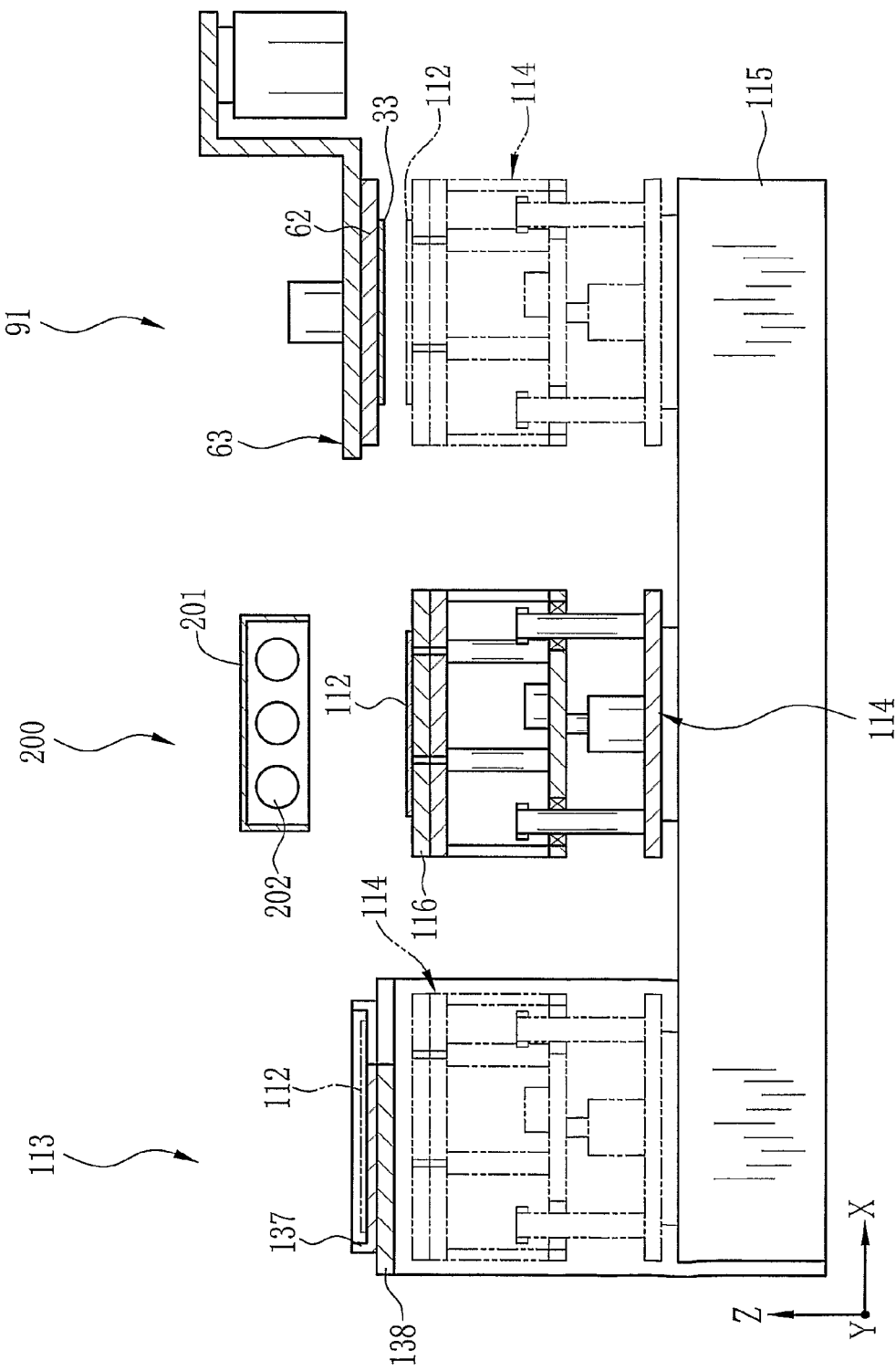
FIG. 30 is an explanatory view showing an embodiment which has an illumination station between the transcribing station and the film supplying section.

In the above embodiment, the normal temperature curable adhesive is used as the adhesive 8, and its viscosity is adjusted by the time process. However, there are problems that the time process requires considerable time and that foreign matters may be adhered to the adhesive while the time process. In considering these problems, light-delayed curing adhesive for starting curing when being irradiated with light such as ultraviolet lay can be used as the adhesive 8. In this case, for example as shown in FIG. 30, an illumination station 200 is provided between the transcribing station 91 and the film supplying section 113. The transcribing unit 114 is stopped at the illumination station 200, and a lump 202 of an illumination device 201 irradiates ultraviolet ray on the transcribing film 112. Accordingly, the curing of the adhesive can start before transcribing the adhesive in the transcribing station 91.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

INDUSTRIAL APPLICABILITY

The present invention is applicable to a device for joining substrates for manufacturing a solid state imaging device. The present invention is also applicable to a device for joining substrates for manufacturing other chip size packages which require joining substrates.

The invention claimed is:

1. A device for joining substrates which is used for manufacturing a chip size package formed in a way that a semiconductor substrate with plural elements formed thereon and a sealing substrate for individually sealing said elements are joined together and diced into a plurality of said chip size packages having said individual sealed element, comprising:
   a substrate supplying section for supplying said semiconductor substrate and said sealing substrate;
   a transcribing sheet supplying section for supplying an elastic transcribing sheet on which adhesive is coated;
   a transcribing sheet pressurization section for pressurizing together a joint surface of said transcribing sheet coated with said adhesive and a joint surface of said sealing substrate;
   a transcribing sheet peeling section for peeling said transcribing sheet from said sealing substrate so as to form a layer of said adhesive on said sealing substrate;
   a parallelism adjusting section for adjusting parallelism of said joint surface of said semiconductor substrate and said joint surface of said sealing substrate on which said adhesive layer is formed;
   a substrate joining section for adjusting positions of said semiconductor substrate and said sealing substrate, and then joining said semiconductor substrate and said sealing substrate which are adjusted their positions; and
   a substrate conveying mechanism for conveying said semiconductor substrate, said sealing substrate and said transcribing sheet among said respective sections.

2. A device for joining substrates as described in claim 1, wherein said chip size package is a solid state imaging device, and said sealing substrate is formed of a transparent material.

3. A device for joining substrates as described in claim 2, wherein said element is an image sensor, and said sealing substrate is constituted of a glass substrate and plural flame-like spacers which individually surround said image sensors.

4. A device for joining substrates as described in claim 1, wherein said transcribing sheet peeling section comprises:
   a peeling roller provided close to one end of said sealing substrate which is set at a position for peeling said transcribing sheet;
   a long adhesive tape being hanged on said peeling roller and contacting to one end of said transcribing sheet;
   a roller moving mechanism for moving said peeling roller from a position near said one end of said sealing substrate to a position near another end of said sealing substrate; and
   a winding section for winding said adhesive tape in synchronization with move of said peeling roller by said roller moving mechanism so as to keep a constant angle between said peeled transcribing sheet and said joint surface of said sealing substrate.

5. A device for joining substrates as described in claim 4, said transcribing sheet peeling section further comprising:
   a roller clearance adjusting mechanism for moving said peeling roller so as to adjust clearance between said peeling roller and said transcribing sheet before peeled, in a direction perpendicular to said joint surface of said sealing substrate which is set at a position for being joined with said transcribing sheet.

6. A device for joining substrates as described in claim 4, a clearance between an outer peripheral surface of said adhesive tape hanged on said peeling roller and said transcribing sheet being 0.1 mm or less when said transcribing sheet is peeled.

7. A device for joining substrates as described in claim 4, wherein said peeling roller has a diameter of between 15 mm and 20 mm.

8. A device for joining substrates as described in claim 1, wherein said transcribing sheet is an antistatic plastic film.

9. A device for joining substrates as described in claim 1, wherein said transcribing sheet pressurization section pressurizes said transcribing sheet through a cushion.

10. A device for joining substrates as described in claim 9, wherein said cushion is a sponge rubber having hardness of ASKER-C 20-40.

11. A device for joining substrates as described in claim 1, said parallelism adjusting section comprising:
   a plurality of substrate clearance measurement section for measuring clearances between said joint surface of said semiconductor substrate and said joint surface of said sealing substrate at plural measurement points; and
   a substrate inclination adjusting section for adjusting inclinations of said semiconductor substrate or said sealing substrate based on measurement result from said substrate clearance measurement section.

12. A device for joining substrates as described in claim 11, wherein said substrate clearance measurement section comprises:
   a plurality of transmission illuminating devices for emitting transmission light to said measurement points between said joint surface of said semiconductor substrate and said joint surface of said sealing substrate;
   a plurality of substrate clearance imaging devices provided corresponding to said transmission illuminating devices, for imaging said semiconductor substrate and said sealing substrate which are illuminated at said measurement points; and
   a substrate clearance calculating device for calculating lengths of said clearances between said joint surfaces of said semiconductor substrate and said sealing substrate at said measurement points by analyzing image data from said plurality of substrate clearance imaging devices.

13. A device for joining substrates as described in claim 12, wherein said transmission illuminating device has a converging angle of 1° or less.

14. A device for joining substrates as described in claim 12, wherein said substrate clearance imaging device has a telecentric lens which only parallel lights can enter.

15. A device for joining substrates as described in claim 11, wherein said substrate clearance measurement section has a laser measurement device for measuring distance between said joint surface of said semiconductor substrate and said joint surface of said sealing substrate at predetermined points.

16. A device for joining substrates as described in claim 11, wherein said substrate inclination adjusting section comprises:
- a plurality of actuators positioned corresponding to said measurement positions of said substrate clearance measurement section, for moving plural predetermined positions of said semiconductor substrate or said sealing substrate in perpendicular direction of said joint surface;
- an actuator controller for controlling said actuators based on measurement result from said substrate clearance measurement section; and
- a plate supporting mechanism for swingably supporting either one of said semiconductor substrate and said sealing substrate to follow the other substrate when joining said semiconductor substrate and said sealing substrate, with swing reference of said supported substrate being in the same plane as said joint surface of said supported substrate.

17. A device for joining substrates as described in claim 1, wherein said parallelism adjusting section comprises:
- a plurality of displacement amount measuring section for measuring displacement amounts of said joint surface of said semiconductor substrate and said joint surface of said sealing substrate at plural measurement points from predetermined reference positions in a direction perpendicular to said joint surfaces; and
- a substrate inclination adjusting section for adjusting inclinations of said semiconductor substrate or said sealing substrate based on measurement result from said displacement amount measuring section.

18. A device for joining substrates as described in claim 17, wherein said substrate inclination adjusting section comprises:
- a plurality of actuators positioned corresponding to said measurement positions of said displacement amount measuring section, for moving plural predetermined positions of said semiconductor substrate or said sealing substrate in perpendicular direction of said joint surface;
- an actuator controller for controlling said actuators based on measurement result from said displacement amount measuring section; and
- a plate supporting mechanism for swingably supporting either one of said semiconductor substrate and said sealing substrate to follow the other substrate when joining said semiconductor substrate and said sealing substrate, with swing reference of said supported substrate being in the same plane as said joint surface of said supported substrate.

19. A device for joining substrates as described in claim 1, wherein said parallelism adjusting section comprises:
- a support plate for holding said semiconductor substrate or said sealing substrate; and
- a plate holding mechanism for holding said support plate in a swingable manner with said semiconductor substrate and said sealing substrate contacting each other, and for fixing said support plate said supported substrate swings to follow said other substrate.

20. A device for joining substrates as described in claim 19, wherein said plate holding mechanism comprises:
- a spherical shaft integrated with said support plate;
- a spherical receiver for swingably supporting said spherical shaft; and
- an air pump for sending air in between said spherical shaft and said spherical receiver so as to allow movement of said spherical shaft, and for sucking said air from between said spherical shaft and said spherical receiver so as to fix said spherical shaft on said spherical receiver.

21. A device for joining substrates as described in claim 1, wherein said substrate joining section comprises:
- an underside support plate for holding said sealing substrate or said semiconductor substrate;
- a position adjusting section for moving said underside support plate in a plane direction and a rotational direction so as to adjust positions of said sealing substrate and said semiconductor substrate;
- a topside support plate positioned above and faced to said underside support plate, for holding said sealing substrate whose position is adjusted so as to face said underside support plate; and
- a pressure mechanism for pressing said underside support plate toward said topside support plate when said semiconductor substrate and said sealing substrate are joined.

22. A device for joining substrates as described in claim 21, wherein said pressure mechanism has a pressure control mechanism for controlling pressure of said pressure mechanism so as not to exceed a predetermined value.

23. A device for joining substrates as described in claim 1, wherein said adhesive on said transcribing sheet is light-delayed curing adhesive, and said device for joining substrates further comprises an illumination station for irradiating light to start the curing of said adhesive before said adhesive is transcribed onto said sealing substrate.

24. A device for joining substrates as described in claim 1, wherein said device for joining substrates is set inside a clean booth which is sealed from outside.

* * * * *